(12) United States Patent
Arai et al.

(10) Patent No.: US 9,875,786 B2
(45) Date of Patent: *Jan. 23, 2018

(54) OUTPUT BUFFER CIRCUIT WITH LOW SUB-THRESHOLD LEAKAGE CURRENT

(71) Applicant: MICRON TECHNOLOGY, INC., Boise, ID (US)

(72) Inventors: Tetsuya Arai, Tokyo (JP); Yoshinori Matsui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,507

(22) Filed: Oct. 25, 2016

(65) Prior Publication Data

US 2017/0040049 A1 Feb. 9, 2017

Related U.S. Application Data

(63) Continuation of application No. 14/508,943, filed on Oct. 7, 2014, now Pat. No. 9,502,083.

(30) Foreign Application Priority Data

Oct. 7, 2013 (JP) .................................. 2013-209988

(51) Int. Cl.
G11C 7/10 (2006.01)
G11C 11/4093 (2006.01)
H03K 17/687 (2006.01)
G11C 11/4096 (2006.01)
G11C 11/4074 (2006.01)
G11C 29/02 (2006.01)

(Continued)

(52) U.S. Cl.
CPC .......... *G11C 11/4093* (2013.01); *G11C 7/106* (2013.01); *G11C 7/1057* (2013.01); *G11C 11/4074* (2013.01); *G11C 11/4096* (2013.01); *G11C 29/022* (2013.01); *G11C 29/028* (2013.01); *G11C 29/50008* (2013.01); *H03K 17/687* (2013.01); *G11C 11/4076* (2013.01)

(58) Field of Classification Search
CPC ............ G11C 11/4093; G11C 11/4096; G11C 11/4074; G11C 29/50008; G11C 29/028; G11C 29/022; G11C 7/106; G11C 7/1057; G11C 11/4076; H03K 17/687
USPC ..................................... 365/189.05
See application file for complete search history.

(56) References Cited

U.S. PATENT DOCUMENTS

2005/0127947 A1* 6/2005 Arnold ............. H03K 19/00384
326/93
2008/0054981 A1* 3/2008 Hosoe .............. H03K 19/00384
327/333

(Continued)

FOREIGN PATENT DOCUMENTS

JP 2000-030443 1/2000
JP 2000-195254 7/2000

*Primary Examiner* — Tha-O H Bui
(74) *Attorney, Agent, or Firm* — Dorsey & Whitney LLP

(57) ABSTRACT

A device includes a cutting circuit that is coupled between power supply lines in series with first and second output circuits which drive an output terminal in a push-pull manner. Each of the first and second output circuits includes a plurality of output transistors. The cutting circuit is rendered non-conductive when each of the transistors in the first and second output circuits is rendered non-conductive.

18 Claims, 16 Drawing Sheets

(51) Int. Cl.
    *G11C 29/50* (2006.01)
    *G11C 11/4076* (2006.01)

(56) References Cited

U.S. PATENT DOCUMENTS

| 2010/0110801 A1* | 5/2010 | Song .................. G11C 5/143 |
| | | 365/189.05 |
| 2016/0078909 A1 | 3/2016 | Arai et al. |

* cited by examiner

| STATE OF SEMICONDUCTOR DEVICE 10 | | S1 | S2 | S3 | S4 | S5 | S6 | | | S7 | S8 |
|---|---|---|---|---|---|---|---|---|---|---|---|
| | | POWERDOWN | EXIT POWERDOWN | PRE | ACT | WRITE | READ | | | PRE | POWERDOWN |
| READ DATA RD | | - | | | | | L | H | L | - | |
| STATE OF PULLUP-CIRCUIT PU | | OFF | | | | | OFF | ON | OFF | OFF | |
| STATE OF CURRENT CUTTING CIRCUIT CTU | [1] | OFF | | | | | ON | | | OFF | |
| | [2] | OFF | ON | | | | | | | | |
| | [3] | OFF | | ON | | | | | | | |
| | [4] | OFF | | | | | OFF | ON | OFF | OFF | |

FIGURE 5

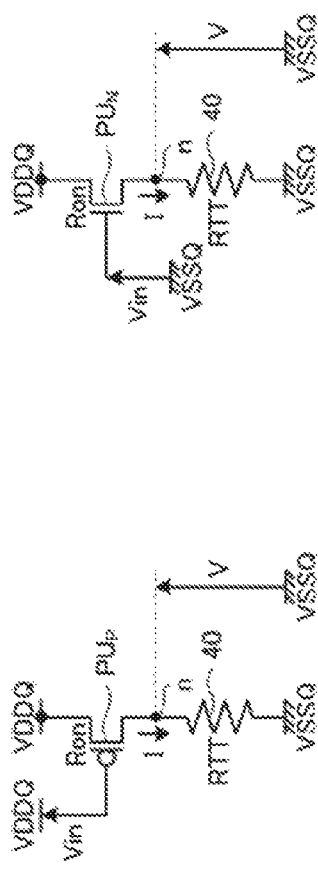
Figure 15 (C)
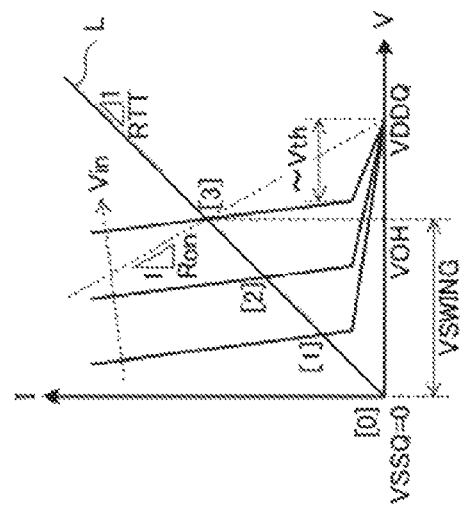
Figure 15 (A)
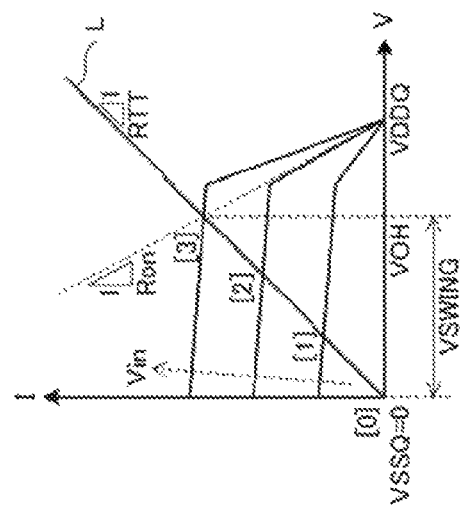
Figure 15 (D)
Figure 15 (B)

OUTPUT BUFFER CIRCUIT WITH LOW SUB-THRESHOLD LEAKAGE CURRENT

CROSS-REFERENCE TO RELATED APPLICATION

This application is a continuation of pending U.S patent application Ser. No. 14/508,943, filed Oct. 7, 2014, and issued as U.S Pat. No. 9,502,083 on Nov. 22, 2016, which application is based upon and claims the benefit of priority from Japanese patent Application No. 2013-209988, filed on Oct. 7, 2013. The aforementioned applications and patent are incorporated herein by reference, in their entirety, for any purpose.

BACKGROUND OF THE INVENTION

Field of the Invention

Embodiments of the present invention relate to a semiconductor device and particularly relates to a semiconductor device having an output buffer capable of impedance adjustment.

Description of Prior Art

A number of MOS transistors are used in semiconductor devices, such as RAM (Dynamic Random Access Memory). These MOS transistors are required to be able to operate at high speed with low operating voltage. To meet this requirement, MOS transistors with a low threshold voltage have come into wide use in these days. The MOS transistor with a low threshold voltage, however, produces a large leakage current (sub-threshold leakage current) when switched off, thus creating a demand for a reduction in such a sub-threshold leakage current.

Japanese Patent Application Laid-Open No. 2000-30443 and Japanese Patent Application Laid-Open No. 2000-195254 disclose an example of a technique for reducing a sub-threshold leakage current from a CMOS composed of MOS transistors with a low threshold voltage. FIG. 2 of Japanese Patent Application Laid-Open No. 2000-195254 depicts a technique of reducing a sub-threshold leakage current generated when the CMOS is in a stand-by mode by interposing a MOS transistor with a high threshold voltage between a power line and the source of an NMOS transistor or PMOS transistor making up the COM that switches off in the stand-by mode.

A certain type of a semiconductor device has an output buffer made up of a pull-up circuit and a pull-down circuit. Such an output buffer operates in such a way that when the output buffer outputs a high-voltage level signal, the pull-up circuit is switched on while the pull-down circuit is switched off and that when the output buffer outputs a low-voltage level signal, the pull-up circuit is switched off while the pull-down circuit is switched on. In its stand-by mode, the output buffer's pull-up circuit and pull-down circuit are both switched off, which gives the output terminal of the output buffer high impedance.

The pull-up circuit and the pull-down circuit are each composed of MOS transistors. There is a growing demand in recent years that using MOS transistors with a low threshold voltage as the pull-up circuit and pull-down circuit to realize a low operating voltage and a high operation speed. Therefore, for the output buffer, a technique for reducing a sub-threshold leakage current in the stand-by mode is in demand.

SUMMARY

According to one aspect of the present invention, a device includes: first and second power terminals; an output terminal; a plurality of first output transistors each including a first gate and first and second nodes, the first node of each of the first output transistors being coupled to the first power terminal and the second node of each of the first output transistors being coupled to the output terminal; a plurality of second output transistors including a second gate and third and fourth nodes, the third node of each of the second output transistors being coupled to the output terminal and the fourth node of each of the second output transistors being coupled to the second power terminal; a control circuit producing a set of first control signals and a set of second control signals, the first control signals being supplied respectively to the first gates of the first output transistors to render selected one or ones of the first output transistors conductive or to render each of the first output transistors non-conductive, and the second control signals being supplied respectively to the second gates of the second output transistors to render selected one or ones of the second output transistors conductive or to render each of the second output transistors non-conductive; and a cutting circuit inserted between the first and second power terminals and being rendered non-conductive between the first and second power supply lines when the each of the first and second output transistors is rendered non-conductive.

According to another aspect of the present invention, a device includes: first and second power supply lines; a data terminal; a first output circuit coupled between the first power supply line and the data terminal, and the first output circuit including a plurality of first output transistors coupled in parallel to each other, each of the first output transistors being of a first conductivity type; a second output circuit coupled between the data terminal and the second power supply line, the second output circuit including a plurality of second output transistors coupled in parallel to each other, each of the second output transistors being of the first conductivity type; a plurality of first logic circuits each associated with a corresponding one of the first output transistors; a plurality of second logic circuits each associated with a corresponding one of the second output transistors; and a cutting transistor inserted between the first and second power supply lines in series with the first and second output circuits, the cutting transistor being of a second conductivity, and the first and second conductivity types being different from each other.

According to still another aspect of the present invention, a device includes: a data node supplied with a data signal; a plurality of first control nodes supplied with a plurality of first control signals, respectively; a plurality of second control nodes supplied with a plurality of second control signals, respectively; an output terminal; first and second intermediate nodes; a plurality of first transistors each coupled between the output terminal and the first intermediate node and configured to drive the output terminal when rendered conductive in response to the data signal and an associated one of the first control signals; a plurality of second transistors each coupled between the output terminal and the second intermediate node and configured to drive the output terminal when rendered conductive in response to the data signal and an associated one of the second control signals; a power supply line; a third control node supplied with a third control signal, the third control signal being independent of each of the first and second control signals; and a cutting circuit coupled between the power supply line and one of the first and second intermediate nodes and configured to form an electrical path therebetween when rendered conductive in response to the third control signal.

BRIEF DESCRIPTION OF THE DRAWINGS

FIG. 5 is a table indicating the relation between states of the semiconductor device of FIG. 2 that are specified by a command COM and respective conduction states of a pull-up circuit and a current cut circuit of FIG. 3.

FIG. 15(a) depicts a potential relation in a stationary state that results when the pull-up circuit of FIG. 14 is composed of a P-channel type MOS transistor, FIG. 15(b) depicts the I-V characteristics of a configuration shown in FIG. 15(a), FIG. 15(c) depicts a potential relation in a stationary state that results when the pull-up circuit of FIG. 14 is composed of a N-channel type MOS transistor, and FIG. 15(d) depicts the I-V characteristics of a configuration shown in FIG. 15(c).

DETAILED DESCRIPTION OF THE EMBODIMENTS

Embodiments of the present invention will hereinafter be described in detail, referring to the accompanying drawings.

Figure 1:
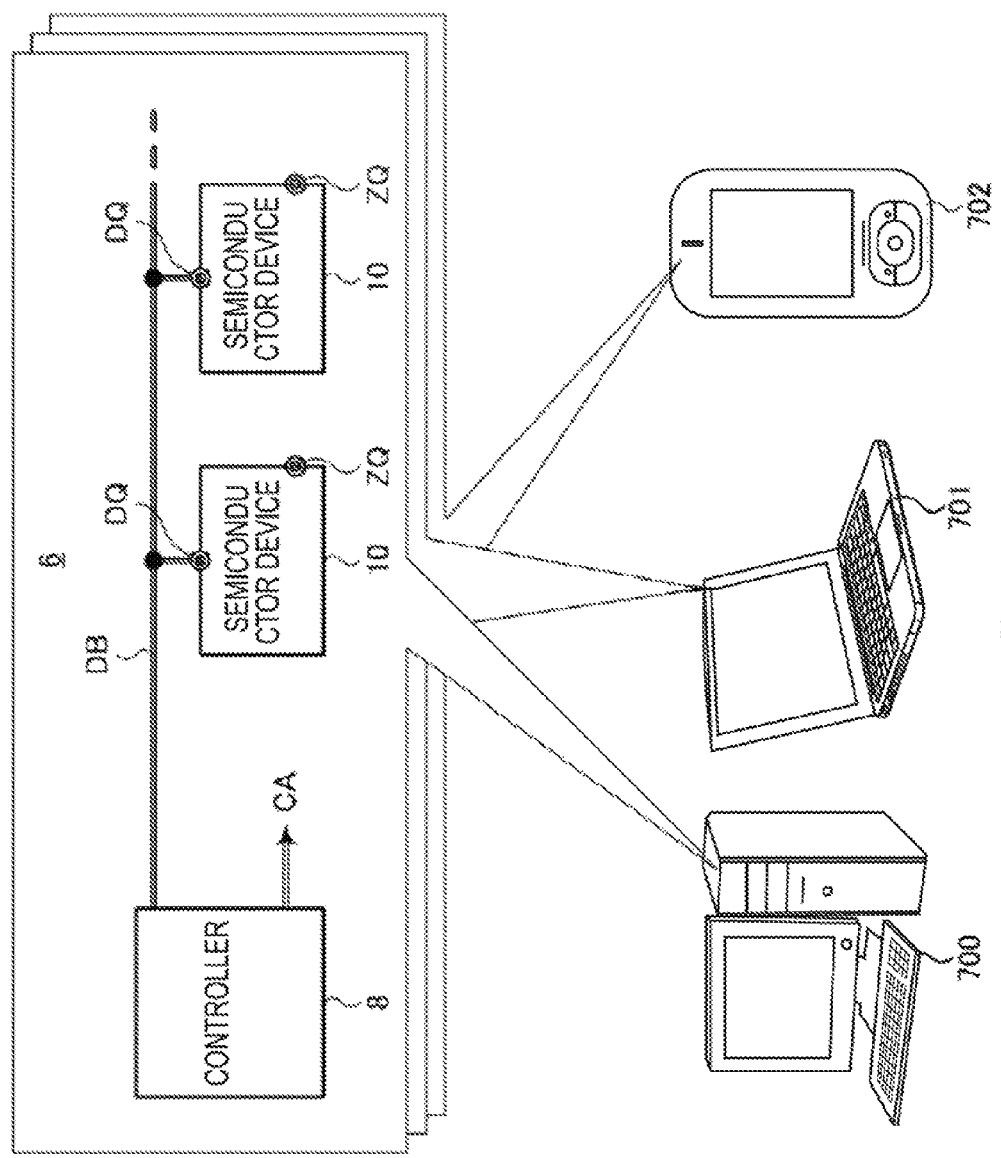
FIG. 1 is a block diagram showing a configuration of a system including a semiconductor device according to an embodiment of the present invention.

FIG. 1 is a block diagram showing a configuration of a system 6 including a semiconductor device 10 according to an embodiment of the present invention.

The system 6 of FIG. 1 includes multiple semiconductor devices 10 and a controller 8 that controls the semiconductor devices 10. Each semiconductor device 10 serves as a DRAM (the form of the semiconductor devices 10 is not limited to the DRAM), performing data reading and writing operations based on a command address signal CA supplied from the controller 8.

As shown in FIG. 1, the semiconductor device 10 has a data input/output terminal DQ and a calibration terminal ZQ. The data input/output terminal DQ is a terminal for outputting read data and receiving incoming write data. Read data output from the data input/output terminal DQ by the semiconductor device 10 is supplied to the controller 8 via a data bus DB. Write data is supplied from the controller 8 to the data input/output terminal DQ via the data bus DB. As shown in FIG. 1, the data bus DB is connected to each of the multiple semiconductor devices 10. According to this embodiment, the semiconductor device 10 is defined as the semiconductor device capable of data input (data writing). Embodiments of the present invention, however, may also apply to a semiconductor device dedicated to data output (data reading') only, such as a semiconductor memory device functioning as a ROM. In such a case, the data input/output terminal DQ is replaced with a data output terminal.

The calibration terminal ZQ is a terminal provided for carrying out calibration of the output buffer (output buffer of FIG. 2) that outputs read data, To the calibration terminal ZQ, a reference resistance (reference resistance RZQ of FIG. 2) having a given resistance value is connected. Calibration will be described in detail later.

Specifically, as shown in FIG. 1, the system 6 is a computer system making up a desktop PC 700, a notebook PC 701, a smart phone 702, etc. In the case of the system 6 making up the desktop PC 700, the controller 8 is a CPU that assumes a role of controlling not only the semiconductor devices 10 of FIG. 1 but also various devices incorporated in the desktop PC 700, such as input devices including a keyboard and mouse, output devices including a display and speaker, communication devices including a network adaptor, and memory devices including a hard disc.

Figure 2:
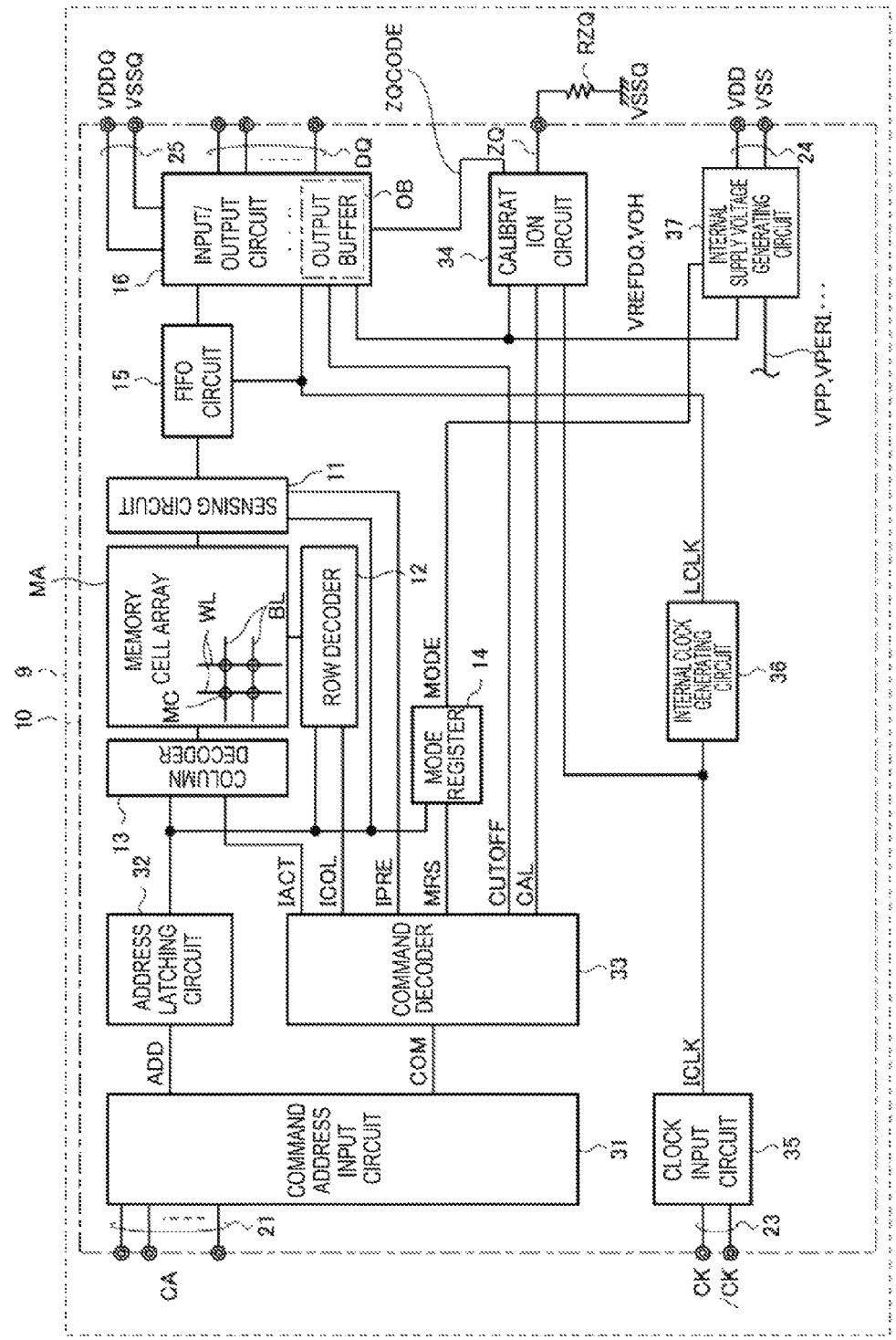
FIG. 2 is a block diagram showing an overall configuration of the semiconductor device of FIG. 1.

FIG. 2 shows an overall configuration of the semiconductor device 10. The overall configuration will then be described, referring to FIG. 2. The semiconductor device 10 is a DDR4 (Double Data Rate 4) DRAM integrated into a single semiconductor chip and is mounted on an external board 9. The external board 9 is a memory module board or mother board provided with the reference resistance RZQ. The reference resistance RZQ is connected to the calibration terminal ZQ of the semiconductor device 10, and the impedance of the reference resistance RZQ serves as reference impedance that is referred to during a calibration operation carried out by a calibration circuit 34. FIG. 2 depicts a case where the calibration terminal ZQ is connected to a power line supplied with a supply voltage VSSQ (ground voltage), via the reference resistance RZQ. However, the calibration terminal ZQ may be connected to a power line supplied with a supply voltage VDDQ (which is higher than the supply voltage VSSQ), via the reference resistance RZQ. Which of these connections is to be selected is determined depending on the contents of the calibration operation. Usually, the resistance value of the reference resistance RZQ is 240Ω.

As shown in FIG. 2, the semiconductor device 10 includes a memory cell array MA. The memory cell array MA has multiple word lines WL, multiple bit lines BL, and memory cells MC are arranged at intersections between the word lines WL and the bit lines BL. Each bit line BL is connected to an FIFO circuit 15 via a sensing amplifier (not depicted) in a sensing circuit 11. Selection of a word line WL is made by a row decoder 12, and selection of a bit line BL (sensing amplifier) is made by a column decoder 13.

In addition to the above data input/output terminal DQ and calibration terminal ZQ, the semiconductor device 10 also includes a command address terminal 21, a clock terminal 23, and power terminals 24 and 25, which all serve as external terminals.

The command address terminal 21 is a terminal that receives the incoming command address signal CA from the controller 8 of FIG. 1. The command address signal CA is made up of an address signal ADD and a command signal COM.

The address signal ADD is address information expressed by multiple bits. The address signal ADD supplied to the command address terminal 21 travels through the command address input circuit 31 to an address latching circuit 32, where the address signal ADD is latched. The address signal ADD is then supplied to the row decoder 12, the column decoder 13, the sensing circuit 11, or a mode register 14. The mode register 14 is a circuit on which a parameter indicative of the operation mode of the semiconductor device 10 is set. The address signal ADD supplied to the mode register 14 indicates the setting contents of a parameter.

The command signal COM is a signal representing various commands issued by the controller 8. Such various commands include an active command, a reading command, a writing command, a pre-charge command, a mode register setting command, a calibration command, a power-down command, and a power-down exiting command. The command signal COM supplied to the command address terminal 21 travels through the command address input circuit 31 to a command decoder 33.

The command decoder 33 is a circuit that decodes the command signal COM to generate various internal commands, which include an active signal IACT, a column signal ICOL, a pre-charge signal IPRE, a mode register setting signal MRS, a cutoff control signal CUTOFF, and a calibration signal CAL.

The active signal IACT is a signal that is activated when the command signal COM is an active command. When the active signal IACT is activated, the address signal ADD latched in the address latching circuit 32 is supplied to the row decoder 12. As a result, a word line WL specified by the address signal ADD is selected (row access).

The column signal ICOL is a signal that is activated when the command signal COM is a reading command or writing command. When the column signal ICOL is activated, the address signal ADD latched in the address latching circuit 32 is supplied to the column decoder 13. As a result, a bit line BL specified by the address signal ADD is selected (column access).

According to the above configuration, the controller 8 inputs an active command and a reading command in sequence and inputs a row address and a column address in synchronization with input of the active command and the reading command, respectively, thereby reads out read data stored in a memory cell MC specified by the row address and column address. The read read-data is transferred through the sensing circuit 11, the FIFO circuit 15, and the input/output circuit 16 and is output from multiple data input/output terminals DQ to the data bus DB (FIG. 1).

The controller 8 inputs an active command and a reading command in sequence and inputs a row address and a column address in synchronization with input of the active command and the reading command, respectively, and then supplies writing data to the data bus DB, thereby writes the write data to a memory cell MC of the semiconductor device 10. Specifically, the write data supplied to the data bus DB is input to the input/output circuit 16 via the data input/output terminals DQ and is transferred through the FIFO circuit 15 and the sensing circuit 11 to the memory cell array MA, where the write data is written to a memory cell MC specified by the row address and the column address.

The pre-charge signal IPRE is a signal that is activated when the command signal COM is a pre-charge command. When the pre-charge signal IPRE is activated, the sensing circuit 11 carries out pre-charging of a bit line BL corresponding to the address signal ADD latched in the address latching circuit 32.

The mode register setting signal MRS is a signal that is activated when the command signal COM is a mode register setting command. The controller 8, therefore, inputs a mode register setting command and inputs a mode signal through the command address terminal 21 in synchronization with input of the mode register setting command, thereby rewrites a preset value for the mode register 14. As indicated in FIG. 2, the preset value for the mode register 14 includes a mode signal MODE, which is supplied to an internal supply voltage generating circuit 37.

The calibration signal CAL is a signal that is activated when the command signal COM is a calibration command. When the calibration signal CAL is activated, the calibration circuit 34 executes a calibration operation to generate a calibration code ZQCODE. A circuit configuration of the calibration circuit 34 and the details of the calibration operation will be described later.

When the command signal COM is a power-down command, the command decoder 33 carries out a process for causing the semiconductor device 10 to enter into a power-down mode. In the power-down mode, input of commands except a power-down exiting command is prohibited. When the command signal COM is a power-down exiting command, the command decoder 33 carries out a process for causing the semiconductor device 10 to exit the power-down mode. Through this process, external commands other than the power-down exiting command can be input to the semiconductor device 10.

The external terminals of the semiconductor device 10 will be described again. External clock signals CK and /CK are input to the clock terminal 23. The external clock signals CK and /CK are complementary to each other and are supplied to a clock input circuit 35, which is a circuit that generates an internal clock signal ICLK in response to the incoming external clock signals CK and /CK. The internal clock signal ICLK is supplied to an internal clock generating circuit 36, which generates an internal clock signal LCLK for data input/output based on the internal clock signal ICLK. The internal clock signal LCLK is supplied to the FIFO circuit 15 and the input/output circuit 16, where the internal clock signal LCLK is used as a timing signal for determining output timing of read data and input timing of write data. The internal clock signal ICLK is supplied also to various circuit blocks, such as the calibration circuit 34, where the internal clock signal ICLK determines operation timing of the circuit blocks.

The power terminal 24 is a terminal supplied with supply voltages VDD and VSS. The supply voltages VDD and VSS supplied to the power terminal 24 are input to the internal supply voltage generating circuit 37. The internal supply voltage generating circuit 37 has a function of generating internal voltages VPP and VPERI and reference voltages VREFDQ and VOH based on the supply voltages VDD and VSS. The internal voltage VPP is used mainly at the row decoder 12 and the internal voltage VPERI is used at a number of other circuit blocks. The reference voltages VREFDQ and VOH are used at the calibration circuit 34. The reference voltages VREFDQ and VOH will be described in detail later.

The power terminal 25 is a terminal supplied with the supply voltages VDDQ and VSSQ. The supply voltages VDDQ and VSSQ supplied to the power terminal 25 are input to the input/output circuit 16. The supply voltages VDDQ and VSSQ are identical in potential with the supply voltages VDD and VSS supplied to the power terminal 24, respectively. To prevent power noises generated by the input/output circuit 16 from reaching a different circuit block, the dedicated supply voltages VDDQ and VSSQ are used at the input/output circuit 16.

Out of the configurations described above, respective configurations of the input/output circuit 16 and the output buffer OB included therein and a configuration of the calibration circuit 34 characterize the embodiment of the present invention. Hereinafter, to facilitate understanding of the embodiments of the present invention, a configuration of the input/output circuit 16 according to a technique for the present invention will be mentioned first and then the configurations characterizing the present invention will be described in detail.

Figure 16:
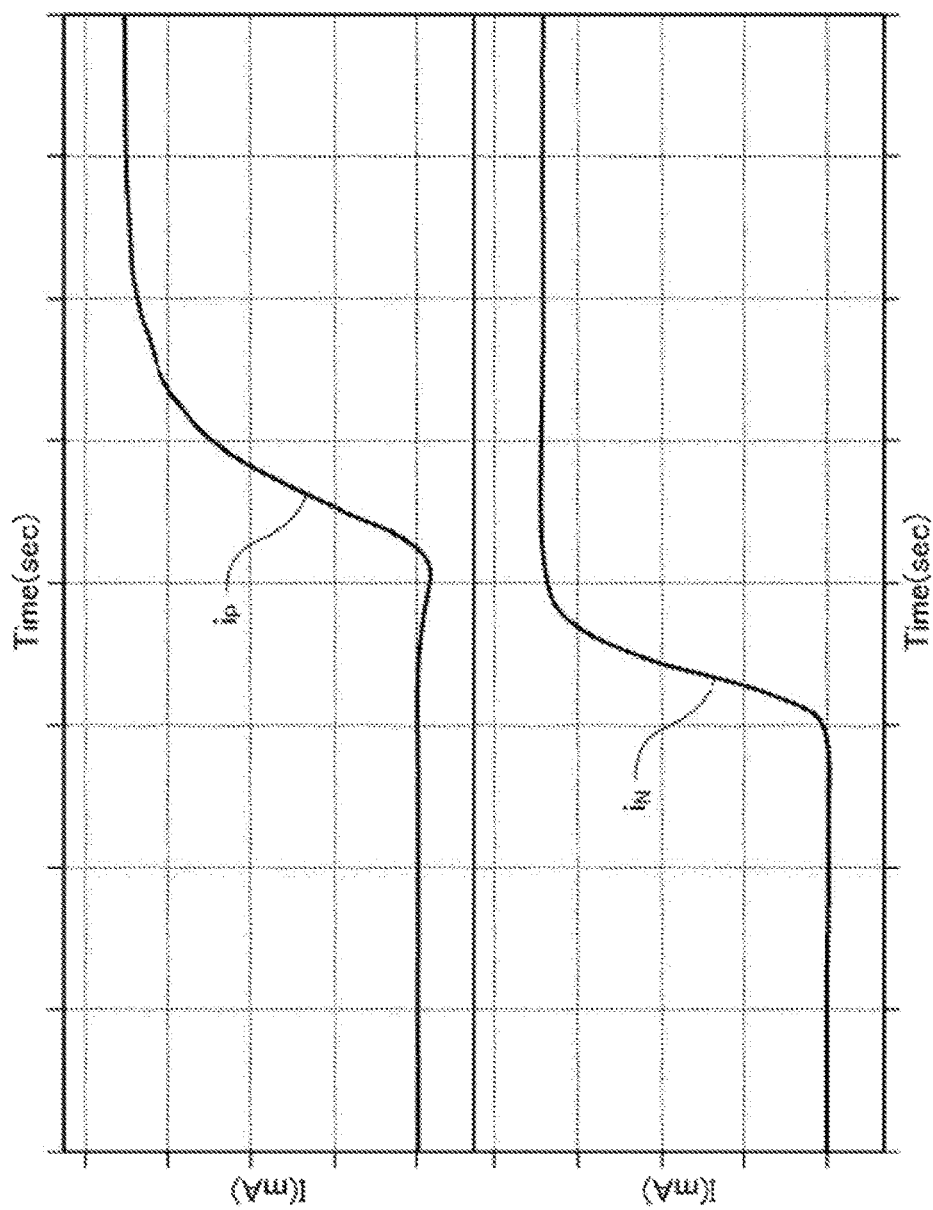
FIG. 16 depicts time-dependent shifts of the current I shown in FIGS. 15(a) and 15(c).

The input/output circuit 16 according to the technique for the present invention will first be described, referring to FIGS. 14 to 16.

Figure 14:
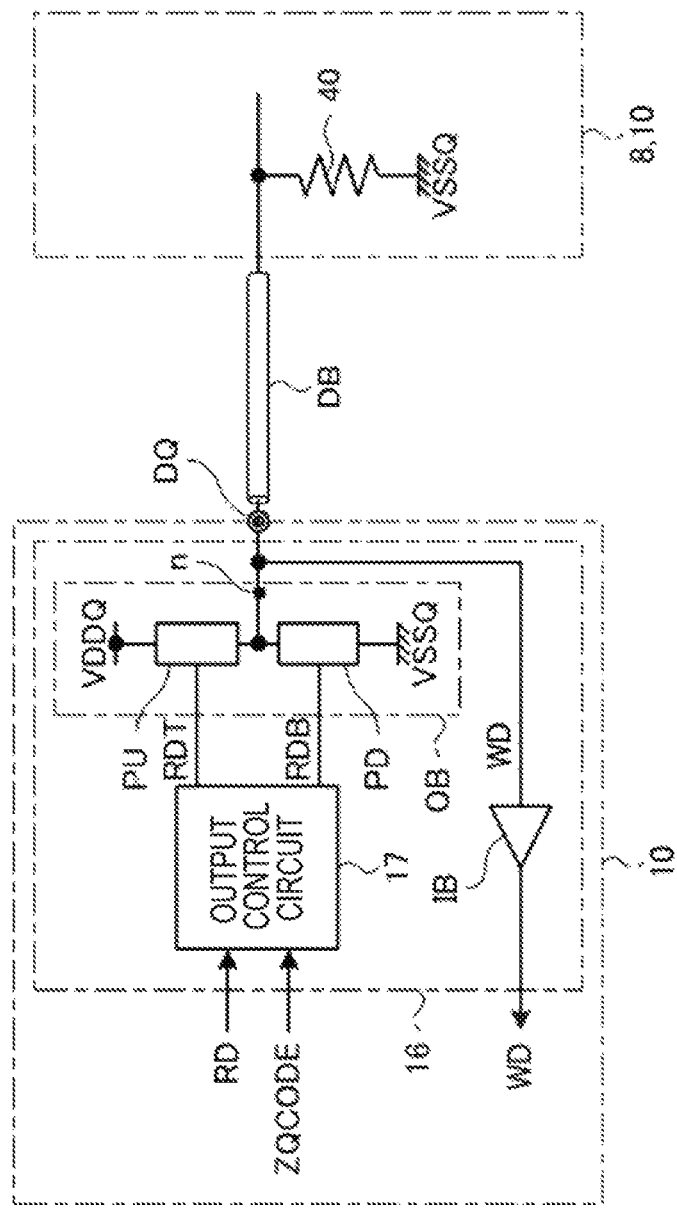
FIG. 14 is a block diagram of an internal configuration of the input/output circuit included in a semiconductor device according to a technique for the present invention.

FIG. 14 shows the input/output circuit 16 according to the technique that has the output buffer OB, an input buffer IB, and an input control circuit 17. The output buffer OB and input buffer IB are connected in common to the data input/output terminal DQ. When the input/output circuit 16 outputs read data RD (carries out a reading operation), the read data RD is supplied from the FIFO circuit 15 of FIG. 2 to the output control circuit 17, which controls the output buffer OB according to the read data RD, thereby outputs the reading data RD. When the input/output circuit 16 receives incoming write data WD (carries out a writing operation), the write data WD supplied to the data input/output terminal DQ is transferred through the input buffer IB to the FIFO circuit 15 of FIG. 2.

The output buffer OB includes an output node n connected to the data input/output terminal DQ, a pull-up circuit PU, and a pull-down circuit PD.

The pull-up circuit PU has one end supplied with the supply voltage VDDQ and the other end connected to the output node n. The pull-up circuit PU also has multiple MOS transistors (not depicted) connected in parallel between the one end and the other end. The conduction state of the pull-up circuit PU is controlled by switching on and off these MOS transistors, Specifically, switching on any one of the MOS transistors puts the pull-up circuit PU in an on-state, in which case the output node n and a power line supplied with the supply voltage VDDQ are connected to each other via the pull-up circuit PU. In contrast, switching off every MOS transistor puts the pull-up circuit PU in an off-state, in which case the output node n and the power line supplied with the supply voltage VDDQ are, at least in an ideal situation, electrically isolated from each other. Actually, however, because of a sub-threshold leakage current from the MOS transistors, the output node n and the power line supplied with the supply voltage VDDQ are not completely isolated electrically from each other.

The pull-down circuit PD has one end supplied with the supply voltage VSSQ and the other end connected to the output node n. The pull-down circuit PD also has multiple MOS transistors (not depicted) connected in parallel between the one end and the other end. The conduction state of the pull-down circuit PD is controlled by switching on and off these MOS transistors. Specifically, switching on any one of the MOS transistors puts the pull-down circuit PD in an on-state, in which case the output node n and a power line supplied with the supply voltage VSSQ are connected to each other via the pull-down circuit PD. In contrast, switching off every MOS transistor puts the pull-up circuit PD in an off-state, in which case the output node n and the power line supplied with the supply voltage VSSQ are, at least in an ideal situation, electrically isolated from each other. Actually, however, because of a sub-threshold leakage current from the MOS transistors, the output node n and the power line supplied with the supply voltage VSSQ are not completely isolated electrically from each other.

Each of the pull-up circuit PU and the pull-down circuit PD has multiple MOS transistors for the purpose of impedance adjustment. By controlling the number of MOS transistors that are switched on to turn the circuit on, the impedance of the circuit can be changed. Using this fact, the semiconductor device 10 adjusts the impedance of the output buffer OB. A specific operation for such impedance adjustment is the calibration operation mentioned above, which is executed by the calibration circuit 34. The calibration operation will be described in detail later.

The output control circuit 17 generates read data RDT to be supplied to the pull-up circuit PU and read data RDB to be supplied to the pull-down circuit PD, according to the read data RD supplied from the FIFO circuit 15 of FIG. 2. The read data RDT is data for switching on the pull-up circuit PU when the read data RD has a high-voltage level while switching off the pull-up circuit PU when the read data RD has a low-voltage level. The read data RDB is data for switching on the pull-down circuit PD when the read data RD has a low-voltage level while switching off the pull-down circuit PD when the read data RD has a high-voltage level.

The output control circuit 17 is also supplied with the calibration code ZQCODE from the calibration circuit 34 of FIG. 2. The output control circuit 17 performs a role of controlling the number of MOS transistors to be switched on out of the multiple MOS transistors included in the pull-up circuit PU and in the pull-down circuit PD according to the calibration code ZQCODE.

As shown in FIG. 1, the data input/output terminal DO is connected to the controller 8 and to the semiconductor device 10 via the data bus DB. These devices may be provided with a terminator 40, as shown in FIG. 14. In FIG. 14, the terminator 40 is disposed between the data bus DB and the power line supplied with the supply voltage VSSQ. However, the terminator 40 may be disposed between the data bus DB and the power line supplied with the supply voltage VDDQ. The terminator 40 prevents reflection of a signal transmitted through the data bus DB and is enabled when the signal is not transmitted from the above devices. The semiconductor device 10 of this embodiment has a function of enabling the terminator 40, which function (not depicted) is referred to as on die termination (ODT) function.

FIGS. 15(a) and 15(c) shows one of the MOS transistors of the pull-up circuit PU as a typical example, respectively. A configuration of the pull-up circuit PU will be described in detail, referring to FIGS. 15(a) to 15(d). In FIGS. 15(a) and 15(c), a potential difference V represents a potential difference between both ends of the terminator 40 and a current I represents a current flowing from the pull-up circuit PU into the terminator 40. Because the data bus DB is considered to be almost loss-free in its stationary state, the data bus DB is omitted from FIGS. 15(a) and 15(c). FIGS. 15(a) to 15(d) depict a case where the pull-down circuit PD is in its off-state and therefore a sub-threshold leakage current from the pull-down circuit PD is neglected. FIGS. 15(b) and 15(d) are drawn on the assumption that the supply voltage VSSQ is zero.

The pull-up circuit PU may be composed of a P-channel type MOS transistor $PU_P$ (hereinafter "PMOS drive"), as shown in FIG. 15(a), or may be composed of an N-channel type MOS transistor $PU_N$ (hereinafter "NMOS drive"), as shown in FIG. 15(c). The PMOS drive will hereinafter be described. The read data RDT supplied from the output control circuit 17 to the pull-up circuit PU (FIG. 14) is applied as a gate voltage Vin, to the gate electrode of the MOS transistor $PU_P$, as shown in FIG. 15(a). The current I (drain current of the MOS transistor $PU_P$) flowing through the output node n is determined by the gate voltage Vin and the potential difference V, as indicated in FIG. 15(b). FIG. 15(b) depicts the I-V characteristics of the MOS transistor $PU_P$ for four patterns [0] to [3] of the gate voltage Vin. The I-V characteristics of FIG. 15(b) demonstrate that the current I becomes larger as the gate voltage becomes larger.

The potential difference V varies within a variation range VSWING. The minimum in the variation range VSWING is the supply voltage VSSQ. When the maximum in the variation range VSWING is defined as the reference voltage VOH, the reference voltage VOH represents the voltage V at an intersection between the I-V characteristics curve of the MOS transistor $PU_P$ determined by the maximum of the gate voltage Vin and a straight line L shown in FIG. 15(b). In FIG. 15(b), the pattern [3] of gate voltage Vin represents the maximum of the gate voltage Vin. The straight line L represents the load line of the terminator 40 and is the straight line having a gradient of I/RTT that passes through a point (V, I)=(VSSQ, 0), where RTT denotes the resistance value of the terminator 40. The on-resistance Ron of the MOS transistor $PU_P$ is determined from the gradient of a straight line passing through the above intersection and a point (V, I)=(VDDQ, 0).

In recent years, to realize high-speed operation, a reduction in the amplitude of the read data RD appearing at the output node n has been studied. A reduction in the amplitude of the read data RD is equivalent to a reduction in the reference voltage VOH in the above example. It is understood front the above description that a reduction in the reference voltage VOH is realized by increasing the on-resistance Ron of the MOS transistor $PU_P$.

The above explanation applies also to the case of the NMOS drive. However, while the I-V characteristics of the MOS transistor $PU_P$ are constant current source characteristics (common source operation), as indicated in FIG. 15(a), the I-V characteristics of the MOS transistor $PU_N$ are constant voltage source characteristics (source follower operation), as indicated in FIG. 15(c).

The NMOS drive has an advantage of achieving current performance and operation speed higher than that achieved by the PMOS drive. This fact will be described in detail.

The current performance of the MOS transistor increases with an increase in a gain coefficient. A gain coefficient $\beta_P$ for the MOS transistor $PU_P$ and a gain coefficient $\beta_N$ for the MOS transistor $PU_N$ are determined by the following equations (1) and (2), using an approximation of saturation current. In the equations (1) and (2), $V_{thp}$ denotes a threshold voltage for the MOS transistor $PU_P$ and $V_{thn}$ denotes a threshold voltage for the MOS transistor $PU_N$.

[Eq. 1]
$$\frac{\beta_P}{2}(VDDQ - |V_{thp}|)^2 = \frac{VOH}{RTT} \quad (1)$$
$$\beta_P = \frac{2 \cdot VOH}{RTT(VDDQ - |V_{thp}|)^2}$$

[Eq. 2]
$$\frac{\beta_N}{2}((VDDQ - VOH) - V_{thn})^2 = \frac{VOH}{RTT} \quad (2)$$
$$\beta_N = \frac{2 \cdot VOH}{RTT((VDDQ - VOH) - V_{thn})^2}$$

From the equations (1) and (2), a ratio between the gain coefficient $\beta_P$ and the gain coefficient $\beta_N$ is determined by the following equation (3).

[Eq. 3]
$$\frac{\beta_N}{\beta_P} = \left(\frac{VDDQ - |V_{thp}|}{(VDDQ - VOH) - V_{thn}}\right)^2 \quad (3)$$

It follows from the equation (3) that the gain coefficient $\beta_N$ is always larger than the gain coefficient $\beta_P$ unless $|V_{thp}| > VOH + V_{thn}$ is satisfied. Since $|V_{thp}| \leq VOH + V_{thn}$ usually holds true, it can be said that the gain coefficient $\beta_N$ is larger than the gain coefficient $\beta_P$. This leads to a conclusion that the NMOS drive achieves current performance higher than that achieved by the PMOS drive.

For the operation speed, responses of the current I and the potential difference V to step input $v_0$ can be expressed by the following equations (4) to (7) through micro-signal linear approximation of an operation of driving a capacitance C. In the equations (4) to (7), $i_P$, $v_P$, and $g_{mp}$ denote a response of the current I, a response of the potential difference V, and mutual conductance, respectively, for the case of the PMOS drive, and $i_N$, $v_N$, and $g_{mn}$ denote a response of the current I, a response of the potential difference V, and mutual conductance, respectively, for the case of the NMOS drive. The mutual conductance $g_{mp}$ and the mutual conductance $g_{mn}$ are expressed by an equation (8) and an equation (9), respectively, based on the equations (1) and (2).

[Eq. 4]
$$i_p = g_{mp} \cdot RTT \cdot \frac{v_0}{RTT} \quad (4)$$

$$v_p = g_{mp} \cdot RTT \cdot v_0 \cdot \left(1 - e^{\frac{t}{RTT \cdot C}}\right) \quad (5)$$

$$i_N \left\{ g_{mn} \cdot RTT \cdot e^{\frac{t}{RTT \cdot C/(1 + g_{mn} \cdot RTT)}} + \frac{g_{mn} \cdot RTT}{1 + g_{mn} \cdot RTT}\left(1 - e^{\frac{t}{RTT \cdot C/(1 + g_{mn} \cdot RTT)}}\right)\right\} \frac{v_0}{RTT} \quad (6)$$

$$v_n = \frac{g_{mn} \cdot RTT}{1 + g_{mn} \cdot RTT} \cdot v_0 \cdot \left(1 - e^{\frac{t}{RTT \cdot C/(1 + g_{mn} \cdot RTT)}}\right) \quad (7)$$

$$g_{mp} \cdot RTT \approx \frac{2 \cdot VOH}{VDDQ - |V_{thp}|} \quad (8)$$

$$g_{mp} \cdot RTT \approx \frac{2 \cdot VOH}{(VDDQ - VOH) - V_{thn}} \quad (9)$$

Usually, the mutual conductance $g_{mp}$ and the mutual conductance $g_{mn}$ have a mutual relation defined by the following equations (10) and (11). Comparing the equation (4) with the equation (6) on the assumption that this relation holds true leads to a conclusion that the current $i_N$ responds faster than the current $i_P$ at a stage before the voltage $v_N$ follows the step input $v_0$ (first term in { }) and changes to the same extent as the current $i_P$ changes at a stage after the voltage $V_N$ follows the step input v0 (second term in { }). The comparison also reveals that a time constant for the current $i_N$ is reduced by 1+gmn×RTT on the denominator. These results indicate that the NMOS drive achieves operation faster than that achieved by the PMOS drive. FIG. 16 depicts measurements of the currents $i_P$ and $i_N$, which measurements also demonstrate that the NMOS drive achieves operation faster than that achieved by the PMOS drive.

[Eq. 5]

$$g_{mn} \cdot RTT > g_{mp} \cdot RTT \quad (10)$$

$$\frac{g_{mn} \cdot RTT}{1 + g_{mn} \cdot RTT} \approx g_{mp} \cdot RTT \quad (11)$$

In this manner, constructing the pull-up circuit PU as the NMOS drive offers higher current performance and operation speed, compared to the case of constructing the pull-up circuit PU as the PMOS drive. However, the NMOS drive accompanies a disadvantage that an operating point cannot be obtained when $V_{thn}$>VDDQ–VOH is satisfied. For this reason, the threshold voltage $V_{thn}$ must be kept low in the case of the NMOS drive. It is therefore desirable from this point of view that when the pull-up circuit PU is constructed as the NMOS drive, a sub-threshold leakage current should be reduced.

A configuration characterizing embodiments of the present invention will hereinafter be described.

Figure 3:
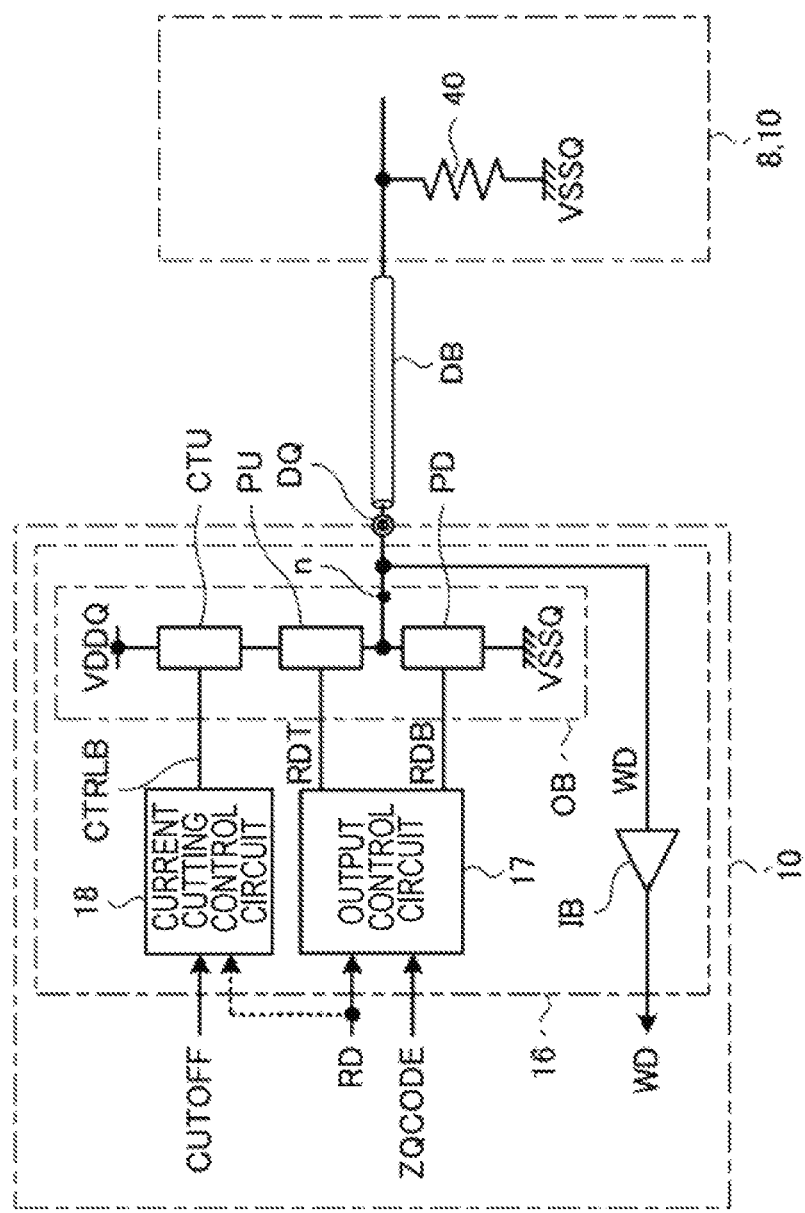
FIG. 3 is a block diagram showing a first example of an internal configuration of an input/output circuit of FIG. 2.

FIG. 3 shows the input/output circuit 16 according to an embodiment. The input/output 16 includes the output buffer OB of FIG. 14 having a current cutting circuit CTU (first current cutting circuit) interposed between the pull-up circuit PU (first output circuit) and the power line supplied with the supply voltage VDDQ (first supply voltage, first power supply line, or first power terminal), and further includes a current cutting control circuit 18.

Figure 4:
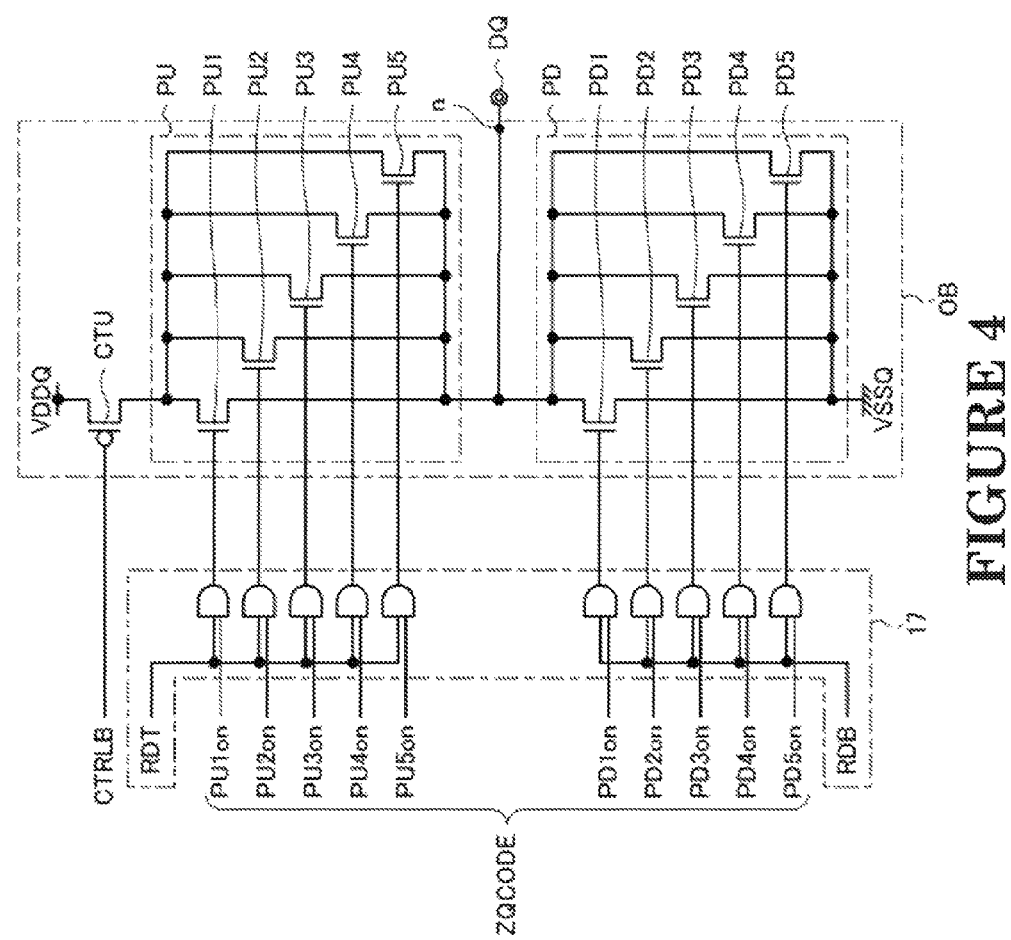
FIG. 4 is a circuit diagram showing a first example of an internal configuration of an output control circuit and an output buffer of FIG. 3.

Specifically, the current cutting circuit CTU is composed of one P-channel type MOS transistor, as shown in FIG. 4. A threshold voltage for this MOS transistor is determined to be higher than a threshold voltage for each of MOS transistors of the pull-up circuit PU. When the pull-up circuit PU is made up of MOS transistors with a low threshold voltage, therefore, a sub-threshold leakage current from the pull-up circuit PU that may flow through the output node n and the terminator 40 can be cut off by switching off the current cutting circuit CTU. According to embodiments of the present invention, when the first output circuit is made up of MOS transistors with a low threshold voltage, a sub-threshold leakage current that may flow through a path between the supply line and the output node can be cut off by switching off the first current cutting circuit. Hence the output buffer including first and second output circuits is able to reduce a sub-threshold leakage current generated in a stand-by mode.

FIG. 4 depicts an example of specific configurations of the pull-up circuit PU, the pull-down circuit PD (second output circuit), and a part of the output control circuit 17. As shown in FIG. 4, the pull-up circuit PU has five N-channel type MOS transistors PU1 to PU5 connected in parallel between the current cutting circuit CTU and the output node n. The pull-down circuit PD has five N-channel type MOS transistors PD1 to PD5 connected in parallel between the power line supplied with the supply voltage VSSQ (second supply voltage, second power supply line, or second power terminal) and the output node n. In this example, the pull-up circuit PU is composed of N-channel type MOS transistors. However, as described above referring to FIG. 15, the pull-up circuit PU may be composed of P-channel type MOS transistors. In this example, each of the pull-up circuit PU and pull-down circuit PD is composed of five MOS transistors. However, the number of the MOS transistors of each of these circuits is not limited to five.

As shown in FIG. 4, the calibration code ZQCODE is composed of partial codes each corresponding to each of the MOS transistors included in the pull-up circuit PU and pull-down circuit PD. In the example of FIG. 4, the calibration code ZQCODE is composed of partial codes PU1on to PU5on corresponding to the MOS transistors PU1 to PU5, respectively, and partial codes PD1 on to PD5 on corresponding to the MOS transistors PD1 to PD5, respectively. The output control circuit 17 has logical circuits each corresponding to each of the MOS transistors included in the pull-up circuit PU and pull-down circuit PD, thus supplying a signal obtained by logical computation of either the read data RDT or RDB and a partial code corresponding to the read data, to the gate electrode of the MOS transistor corresponding to the particle code. In FIG. 4, each logical circuit is depicted as AND circuit. A specific configuration of the logical circuit is, however, selected properly depending on whether an input signal is a high-active signal or low-active signal or on the type of a MOS transistor corresponding to the logical circuit.

FIG. 3 is referred to again. The current cutting control circuit 18 is a circuit that generates a control signal CTRLB for controlling the conduction state of the current cutting circuit CTU, in response to a cutoff control signal CUTOFF (internal command signal) supplied from the command decoder 33 of FIG. 4. The command decoder 33 controls the potential of the cutoff control signal CUTOFF according to various command signals COM. The control signal CTRLB, therefore, changes according to the states of various command signals COM.

Referring to FIG. 5, the relation between the states (S1 to S8) of the semiconductor device 10 specified by the command signal COM and respective conduction states of the pull-up circuit PU and the current cutting circuit CTU will be described in detail. The states S1 to S8 are written in increasing order in line with time-sequence order. Patterns [1] to [4] of FIG. 5 represent a variation of patterns of change of the state of the current cutting circuit CTU. The semiconductor device actually adopts any one of the patterns [1] to [4] and incorporates the adopted pattern into a program run by the command decoder 33. The patterns [1] to [3] will now be described and the pattern [4] will be described later.

The state S1 (Power Down) is a state in which in response to input of the above power down command as the command signal COM, the semiconductor device 10 has entered into a power down mode. In any one of the case of adopting the pattern [1] to the case of adopting the pattern [3], when the command decoder 33 is supplied with the command signal COM serving as the power down command from the command address input circuit 31, the command decoder 33 generates the cutoff control signal CUTOFF for switching off the current cutting circuit CTU and supplies the cutoff control signal CUTOFF to the current cutting control circuit 18. As a result, the current cutting control circuit 18 switches off the current cutting circuit CTU.

The state 2 (exit Power Down) is a state in which in response to input of the power down exit command as the command signal COM, the semiconductor device 10 exits the power down mode to return to its original mode, The state S2 continues until the command decoder 33 is supplied with another command signal COM of any type. In the case of adopting the pattern [3], when the command decoder 33 is supplied with the command signal COM serving as the power down exit command from the command address input circuit 31, the command decoder 33 generates the cutoff control signal CUTOFF for switching on the current cutting circuit CTU and supplies the cutoff control signal CUTOFF to the current cutting control circuit 18. As a result, the current cutting control circuit 18 switches on the current cutting circuit CTU. In the cases of adopting the patterns [1] and [2], when supplied with the command signal COM serving as the power down exit command from the command address input circuit 31, the command decoder 33 does not generate the cutoff control signal CUTOFF. As a result, the current cutting circuit CTU maintains its existing state.

The state S3 (PRE) is a state in which in response to input of the pre-charge command as the command signal COM, the sensing circuit 11 pre-charges a bit line BL. In the cases of adopting the patterns [1] and [2], when the command decoder 33 is supplied with the command signal COM serving as the pre-charge command from the command address input circuit 31, the command decoder 33 generates the cutoff control signal CUTOFF for switching off the current cutting circuit CTU and supplies the cutoff control signal CUTOFF to the current cutting control circuit 18. As a result, the current cutting control circuit 18 switches off the current cutting circuit CTU. In the state S3 of FIG. 5, because the current cutting circuit CTU is off in the state S2 right before the state S3, the state of the current cutting circuit CTU shows no particular change. In the case of adopting the pattern [3], when supplied with the command signal COM serving as the active command from the command address input circuit 31, the command decoder 33 does not generate the cutoff control signal CUTOFF. As a result, a change in the state of the current cutting circuit CTU does not occur.

The state S4 (ACT) is a state in which in response to input of the active command as the command signal COM, the row decoder 12 activates a word line WL. In the case of adopting the pattern [2], when the command decoder 33 is supplied with the command signal COM serving as the active command from the command address input circuit 31, the command decoder 33 generates the cutoff control signal CUTOFF for switching on the current cutting circuit CTU and supplies the cutoff control signal CUTOFF to the current cutting control circuit 18. As a result, the current cutting control circuit 18 switches on the current cutting circuit CTU. In the cases of adopting the patterns [1] and [3], when supplied with the command signal COM serving as the active command from the command address input circuit 31, the command decoder 33 does not generate the cutoff control signal CUTOFF. As a result, a change in the state of the current cutting circuit CTU does not occur.

The state S5 (WRITE) is a state in which in response to input of the writing command as the command signal COM, the column decoder 13 connects a bit line BL to the FIFO circuit 15. As indicated in FIG. 5, input of the writing command does not lead to a change in the state of the current cutting circuit CTU.

The state So (READ) is a state in which in response to input of the reading command as the command signal COM, the column decoder 13 connects a bit line BL to the FIFO circuit 15. In this case, as indicated in FIG. 5, the conduction state of the pull-up circuit PU changes according to the voltage value of the read data RD. Specifically, when the read data RD has a low voltage level (L), the pull-up circuit PU is switched off under control by the output control circuit 17. At this time, the pull-down circuit PD is in its on-state (which is not depicted), in which case the supply voltage VSSQ is supplied to the output node n via the pull-down circuit PD. When the read data RD has a high voltage level (H), in contrast, the pull-up circuit PU is switched on under control by the output control circuit 17, in which case, therefore, the supply voltage VDDQ is supplied to the output node n via the pull-up circuit PU. At this time, the pull-down circuit PD is off.

In the case of adopting the pattern [1], when the command decoder 33 is supplied with the command signal COM serving as the reading command from the command address input circuit 31, the command decoder 33 generates the cutoff control signal CUTOFF for switching on the current cutting circuit CTU and supplies the cutoff control signal CUTOFF to the current cutting control circuit 18. As a result, the current cutting control circuit 18 switches on the current cutting circuit CTU. In the cases of adopting the patterns [2] and [3], when supplied with the command signal COM serving as the active command from the command address input circuit 31, the command decoder 33 does not generate the cutoff control signal CUTOFF. As a result, a change in the state of the current cutting circuit CTU does not occur.

Similar to the state S3, the state 7 (PRE) represents a state in which in response to input of the pre-charge command as the command signal COM, the sensing circuit 11 pre-charges a bit line BL. In the cases of adopting the patterns [1] and [2], in the same manner as in the state S3 described above, the command decoder 33 generates the cutoff control signal CUTOFF for switching off the current cutting circuit CTU and supplies the cutoff control signal CUTOFF to the current cutting control circuit 18. As a result, the current cutting circuit CTU shifts to an off-state. In the case of adopting the pattern [3], in the same manner as in the state S3 described above, the command decoder 33 does not generate the cutoff control signal CUTOFF. As a result, a change in the state of the current cutting circuit CTU does not occur.

Similar to the state S1, the state S8 (Power Down) represents a state in which in response to input of the power down command as the command signal COM, the semiconductor device 10 has entered into the power down mode. In this state, in the same manner as in the state S1 described above, the command decoder 33 generates the cutoff control signal CUTOFF for switching off the current cutting circuit CTU and supplies the cutoff control signal CUTOFF to the current cutting control circuit 18. In the case of adopting the pattern [3], therefore, the current cutting circuit CTU shifts to an off-state. In the cases of adopting the patterns [1] and [2], because the current cutting circuit CTU has already shifted to its off-state in the state S7, a change in the state of the current cutting circuit CTU does not occur.

In the cases of the patterns [1] to [3], the current cutting circuit CTU is kept on while the state S0 continues. However, the current cutting circuit CTU must be brought into its on-state only when the pull-up circuit PU is on, that is, when the read data RD having a high voltage level is output. Therefore, the current cutting circuit CTU may be controlled in such a way that it is switched on only when the pull-up circuit PU is on and is switched off otherwise, as indicated by the pattern [4] of FIG. 5. In such a case, the cutoff control signal CUTOFF is not always necessary, and as indicated by a broken line arrow of FIG. 3, the read data RD may be supplied also to the current cutting control circuit 18, which controls switching on and off of the current cutting circuit CTU according to the voltage level of the read data RD.

As described above, according to the semiconductor device 10 of this embodiment, the current cutting circuit CTU composed of a MOS transistor with a high threshold voltage is interposed between the pull-up circuit PU and the power line supplied with the supply voltage VDDQ so that the conduction state of the current cutting circuit CTU is controlled through the command signal COM (or/and the read data RD). This allows the output buffer OB to reduce a sub-threshold leakage current generated in the stand-by mode.

Now, if what is required to do is to just reduce the sub-threshold leakage current, switching the locations of the pull-up circuit PU and current cutting circuit CTU for each other may be a conceivable option. However, except the case of controlling the conduction state of the current cutting circuit CTU through the read data RD as in the case of the pattern [4] of FIG. 5, this location switching results in an unsharpened signal waveform appearing at the output node n. Such arrangement of the pull-up circuit PU and current cutting circuit CTU, therefore, cannot be adopted. Specifically, when the conduction state of the current cutting circuit CTU is controlled through the cutoff control signal CUTOFF, the current cutting circuit CTU is kept on during a reading operation, in which case the current cutting circuit CTU in its switched location is recognized as a capacitance when a low-voltage level signal is output, that is, when the pull-down circuit PD is switched on. This results in the unsharpened signal waveform. For this reason, according to this embodiment as described above, the current cutting circuit CTU must be disposed closer to the supply line than the pull-up circuit PU.

A configuration and operation of the calibration circuit 34 will then be described in detail.

Figure 6:
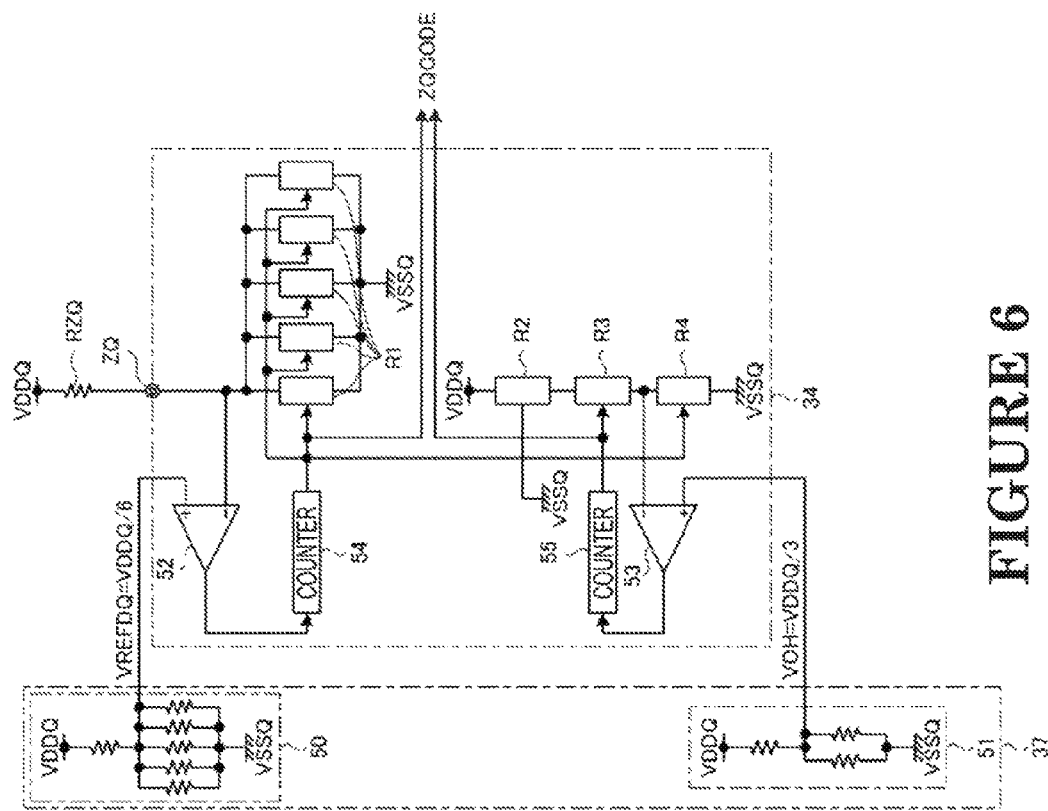
FIG. 6 is a block diagram showing a first example of configuration of a calibration circuit and an internal supply voltage generating circuit of FIG. 2.

FIG. 6 shows the internal supply voltage generating circuit 37, The circuit 37 has a VOH generator 51 (first voltage generating circuit) that generates the above reference voltage VOH (first reference voltage) related to the calibration operation, and a VREFDQ generator 50 (second voltage generating circuit) that generates the reference voltage VREFDQ (second reference voltage) equivalent to a middle potential point between the reference voltage VOH and the supply voltage VSSQ. The value of the reference voltage VOH can be set arbitrarily within a voltage range satisfying the above inequality $|V_{thp}| \le VOH+V_{thn}$. In the example of FIG. 6, the reference voltage VOH is assumed to be ⅓ of the supply voltage VDDQ, in which case the reference voltage VREFDQ is ⅙ of the supply voltage VDDQ.

Specifically, as shown in FIG. 6, the VOH generator 51 has a configuration such that one resistance element is connected between the power line supplied with the supply voltage VDDQ and the output end of the VOH generator 51 while two resistance elements are connected in parallel between the power line supplied with the supply voltage VSSQ and the output end of the VOH generator 51. These three resistance elements have the same resistance value. Because of this configuration, a voltage output from the output end of the VOH generator 51 is ⅓ of the supply voltage VDDQ.

Similarly, the VREFDQ generator 50 has a configuration such that one resistance element is connected between the power line supplied with the supply voltage VDDQ and the output end of the VOH generator 51 while five resistance elements are connected in parallel between the power line supplied with the supply voltage VSSQ and the output end of the VOH generator 51. These six resistance elements have the same resistance value. Because of this configuration, a voltage output from the output end of the VOH generator 51 is ⅙ of the supply voltage VDDQ.

As shown in FIG. 6, the calibration circuit 34 has multiple first replica circuits R1, second to fourth single replica circuits R2 to R4, comparators 52 and 53, and counters 54 and 55. According to this embodiment, the calibration terminal ZQ is connected to the power line supplied with the supply voltage VDDQ, via the reference resistance RZQ, as shown in FIG. 6.

The first replica circuits R1 are a replica of the pull-down circuit PD. When the reference voltage VOH is determined to be ⅓ of the supply voltage VDDQ as described above, five first replica circuits R1 are needed, as shown in FIG. 6. In this embodiment, "replica" of a subject circuit means a circuit substantially identical in configuration and characteristics with the subject circuit. The first replica circuits R1 are connected in parallel between the power line supplied with the supply voltage VSSQ and the calibration terminal ZQ. Hence each of one ends of the first replica circuits R1 is supplied with the supply voltage VSSQ and each of the other ends of the same is connected to the calibration terminal ZQ.

The second replica circuit R2 is a replica of the first current cutting circuit CTU, and has one end supplied with the supply voltage VDDQ. To the gate electrode of a P-channel type MOS transistor of the second replica circuit R2, the supply voltage VSSQ is supplied constantly through a control circuit (not depicted). The second replica circuit R2 is, therefore, constantly kept on. During a period in which the calibration operation is not executed, however, the control circuit (not depicted) constantly supplies the supply voltage VDDQ to the gate electrode of the second replica circuit R2. As a result, a leakage current is cut at the second replica circuit R2. The third replica circuit R2 is a replica of the pull-up circuit PU, and has one end connected to the other end of the second replica circuit R2. The fourth replica circuit R4 is a replica of the pull-down circuit PD, and has one end supplied with the supply voltage VSSQ and the other end connected to the other end of the third replica circuit R3. These second to fourth replica circuits R2 to R4 thus have the same configuration as the configuration of the output buffer OB.

The comparators 52 and 53 and the counters 54 and 55 are circuits for allowing the calibration circuit 34 to execute the calibration operation.

The non-reverse input terminal of the comparator 52 is supplied with the reference voltage VREFDQ from the VREFDQ generator 50. The reverse input terminal of the comparator 52 is connected to the calibration terminal ZQ. The output terminal of the comparator 52 is connected to the counter 54, which generates part of the calibration code ZQCODE (partial codes PD1 on to PD5 on of FIG. 4) based on an output signal from the comparator 52. The generated partial codes PD1 on to PD5 on are supplied to the first replica circuit R1 and to the fourth replica circuit R4.

The non-reverse input terminal of the comparator 53 is supplied with the reference voltage VOH from the VOH generator 51. The reverse input terminal of the comparator 53 is connected to the other end of the third replica circuit R3 (point of connection to the fourth replica circuit R4). The output terminal of the comparator 53 is connected to the counter 55, which generates the rest of the calibration code ZQCODE (partial codes PU1on to PU5on of FIG. 4) based on an output signal from the comparator 53. The generated partial codes PU1on to PU5on are supplied to the third replica circuit R3.

The calibration operation the calibration circuit 34 carries out using the comparators 52 and 53 and the counters 54 and 55 will hereinafter be described in detail.

The basic procedure of the calibration operation executed according to this embodiment is to match the impedance of the pull-down circuit PD to the resistance value of the reference resistance RZQ and then adjust the impedance of the pull-up circuit PU and that of the pull-down circuit PD so that the ratio of the impedance of the pull-down circuit PD to the joint impedance of the pull-up circuit PU and current cutting circuit CTU becomes equal to the ratio of a potential difference VOH-VSSQ given by subtracting the supply voltage VSSQ from the reference voltage VOH to a potential difference VDDQ−VOH given by subtracting the reference voltage VOH from the supply voltage VDDQ.

Specifically, the impedance of each of the first replica circuits R1 is adjusted first through the comparator 52 and the counter 54 so that a voltage at the calibration terminal ZQ becomes equal to the reference voltage VREFDQ. The comparator 52, specifically, outputs a low-voltage level signal when the voltage at the calibration terminal ZQ is higher than the reference voltage VREFDQ and outputs a high-voltage level signal when the voltage at the calibration terminal ZQ is lower than the reference voltage VREFDQ. The counter 54 monitors an incoming voltage at every given time. When the incoming voltage is at a low level, the counter 54 separately controls respective voltage levels of the partial codes PD1on to PD5on so as to increase the number of MOS transistors to be switched on among the multiple MOS transistors included in the first replica circuit R1. This lowers the impedance of each of the first replica circuits R1, thus lowering the voltage at the calibration terminal ZQ. When the incoming voltage is at a high level, in contrast, the counter 54 separately controls respective voltage levels of the partial codes PD1on to PD5on so as to reduce the number of MOS transistors to be switched on among the multiple MOS transistors included in the first replica circuit R1. This raises the impedance of each of the first replica circuits R1, thus raising the voltage at the calibration terminal ZQ. Through the above control process, the voltage at the calibration terminal ZQ settles into the voltage equal to the reference voltage VREFDQ in the end. As described above, the reference voltage VREFDQ is ⅙ of the supply voltage VDDQ. The impedance of each of the first replica circuits R1 after the settlement of the voltage at the calibration terminal ZQ, therefore, becomes equal to the resistance value of the reference resistance RZQ.

As described above, the partial codes PU1on to PU5on generated by the counter 54 are supplied also to the fourth replica circuit R4. After the settlement of the voltage at the calibration terminal ZQ, therefore, the impedance of the fourth replica circuit R4 also becomes equal to the resistance value of the reference resistance RZQ.

Subsequently, the impedance of the third replica circuit R3 is adjusted through the comparator 53 and the counter 55 so that a voltage at the other end of the third replica circuit R3 (point of connection to the fourth replica circuit R4) becomes equal to the reference voltage VOH. The comparator 53, specifically, outputs a low-voltage level signal when the voltage at the other end of the third replica circuit R3 is higher than the reference voltage VOH and outputs a high-voltage level signal when the voltage at the other end of the third replica circuit R3 is lower than the reference voltage VOH. The counter 55 monitors an incoming voltage at every given time in the same manner as the counter 54 does. When the incoming voltage is at a low level, the counter 55 separately controls respective voltage levels of the partial codes PU1on to PU5on so as to reduce the number of MOS transistors to be switched on among the multiple MOS transistors included in the third replica circuit R3. This raises the impedance of the third replica circuit R3, thus lowering the voltage at the other end of the third replica circuit R3. When the incoming voltage is at a high level, in contrast, the counter 55 separately controls respective voltage levels of the partial codes PU1on to PU5on so as to increase the number of MOS transistors to be switched on among the multiple MOS transistors included in the third replica circuit R3. This lowers the impedance of the third replica circuits R3, thus raising the voltage at the other end of the third replica circuit R3. Through the above control process, the voltage at the other end of the third replica circuit R3 settles into the voltage equal to the reference voltage VOH in the end. As described above, the reference voltage VOH is ⅓ of the supply voltage VDDQ. The joint impedance of the second and third replica circuits R2 and R3 after the settlement of the voltage at the other end of the third replica circuit R3 therefore, becomes two times the resistance value of the reference resistance RZQ.

The calibration code ZQCODE adjusted by the calibration circuit 34 in this manner is supplied to the output control circuit 17 in the input/output circuit 16, as shown in FIGS. 2 to 4. Because the output control circuit 17 has its configuration shown in FIG. 4, the result of the calibration operation is reflected on each of the MOS transistors of the pull-up circuit PU and pull-down circuit PD. In this manner, the output buffer OB of the semiconductor device 10 realizes the calibration operation.

The configuration of the calibration circuit 34 and internal supply voltage generating circuit 37 described referring to FIG. 6 is an example of their configuration. A different configuration of the calibration circuit 34 and internal supply voltage generating circuit 37 may be adopted. Second and third examples of the configuration of the calibration circuit 34 and internal supply voltage generating circuit 37 will hereinafter be described in detail, referring to FIGS. 7 and 8.

Figure 7:
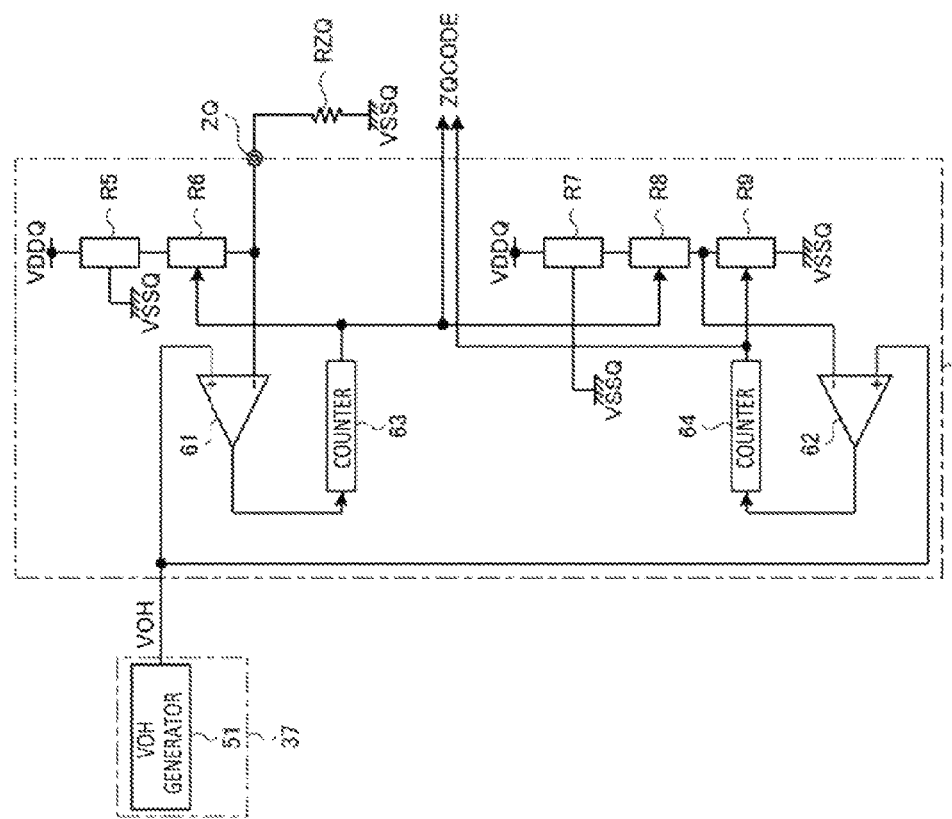
FIG. 7 is a block diagram showing a second example of the configuration of the calibration circuit and the internal supply voltage generating circuit of FIG. 2.

Referring to FIG. 7, the second example of the configuration of the calibration circuit 34 and internal supply voltage generating circuit 37 will first be described, In this example, the internal supply voltage generating circuit 37 is configured to generate only the reference voltage VOH out of the reference voltages VOH and VREFDQ. The internal supply voltage generating circuit 37, therefore, does not have the VREFDQ generator 50, as indicated in FIG. 7.

As shown in FIG. 7, the calibration circuit 34 has fifth to ninth single replica circuits R5 to R9, comparators 61 and 62, and counters 63 and 64. According to this example, the calibration terminal ZQ is connected to the power line supplied with the supply voltage VSSQ, via the reference resistance RZQ, as shown in FIG. 7.

The fifth and seventh replica circuits R5 and R7 are replicas of the first current cutting circuit CTU, and have their respective one ends supplied with the supply voltage VDDQ. To the gate electrode of each of P-channel type MOS transistors of the fifth and seventh replica circuits R5 and R7, the supply voltage VSSQ is supplied constantly through a control circuit (not depicted). The fifth and seventh replica circuits R5 and R7 are, therefore, constantly kept on. During a period in which the calibration operation is not executed, however, the control circuit (not depicted) constantly supplies the supply voltage VDDQ to each of the gate electrodes of the fifth and seventh replica circuits R5 and R7. As a result, a leakage current is cut at the fifth and seventh replica circuits R5 and R7.

The sixth and eighth replica circuits R6 and R8 are replicas of the pull-up circuit PU. The sixth replica circuit R6 has one end connected to the other end of the fifth replica circuit R5, and the eighth replica circuit R8 has one end connected to the other end of the seventh replica circuit R7. The other end of the sixth replica circuit R6 is connected to the calibration terminal ZQ.

The ninth replica circuit R9 is a replica of the pull-down circuit PD, and has one end supplied with the supply voltage VSSQ and the other end connected to the other end of the eighth replica circuit RS.

The comparators 61 and 62 and the counters 63 and 64 are circuits for allowing the calibration circuit 34 to execute the calibration operation.

The non-reverse input terminal of the comparator 61 is supplied with the reference voltage VOH from the VOH generator 51. The reverse input terminal of the comparator 61 is connected to the calibration terminal ZQ. The output terminal of the comparator 61 is connected to the counter 63, which generates part of the calibration code ZQCODE (partial codes PU1on to PU5on of FIG. 4) based on an output signal from the comparator 61. The generated partial codes PU1on to PU5on are supplied to the sixth replica circuit R6 and to the eighth replica circuit R8.

The non-reverse input terminal of the comparator 62 is supplied with the reference voltage VOH from the VOH generator 51. The reverse input terminal of the comparator 62 is connected to the other end of the eighth replica circuit R8 (point of connection to the ninth replica circuit R9). The output terminal of the comparator 62 is connected to the counter 64, which generates the rest of the calibration code ZQCODE (partial codes PD1on to PD5on of FIG. 4) based on an output signal from the comparator 62. The generated partial codes PD1on to PD5on are supplied to the ninth replica circuit R9.

According to the calibration operation of this example, the impedance of the sixth replica circuit R6 is adjusted first through the comparator 61 and counter 63 so that a voltage at the calibration terminal ZQ becomes equal to the reference voltage VOH. The detail of this calibration operation is the same as that of the calibration operation described above referring to FIG. 6 and is therefore omitted in further description. When the reference voltage VOH is determined to be ⅓ of the supply voltage VDDQ, the joint impedance of the fifth and sixth replica circuits R5 and R6 resulting from the calibration operation becomes two times the resistance value of the reference resistance RZQ.

Subsequently, the impedance of the ninth replica circuit R9 is adjusted through the comparator 62 and counter 64 so that a voltage at the other end of the eighth replica circuit R8 (point of connection to the ninth replica circuit R9) becomes equal to the reference voltage VOH. When the reference voltage VOH is determined to be ⅓ of the supply voltage VDDQ, the impedance of the ninth replica circuit R9 resulting from the calibration operation becomes equal to the resistance value of the reference resistance RZQ.

In this manner, the calibration operation according to the second example produces the same result as produced by the calibration operation described above referring to FIG. 6.

Figure 8:
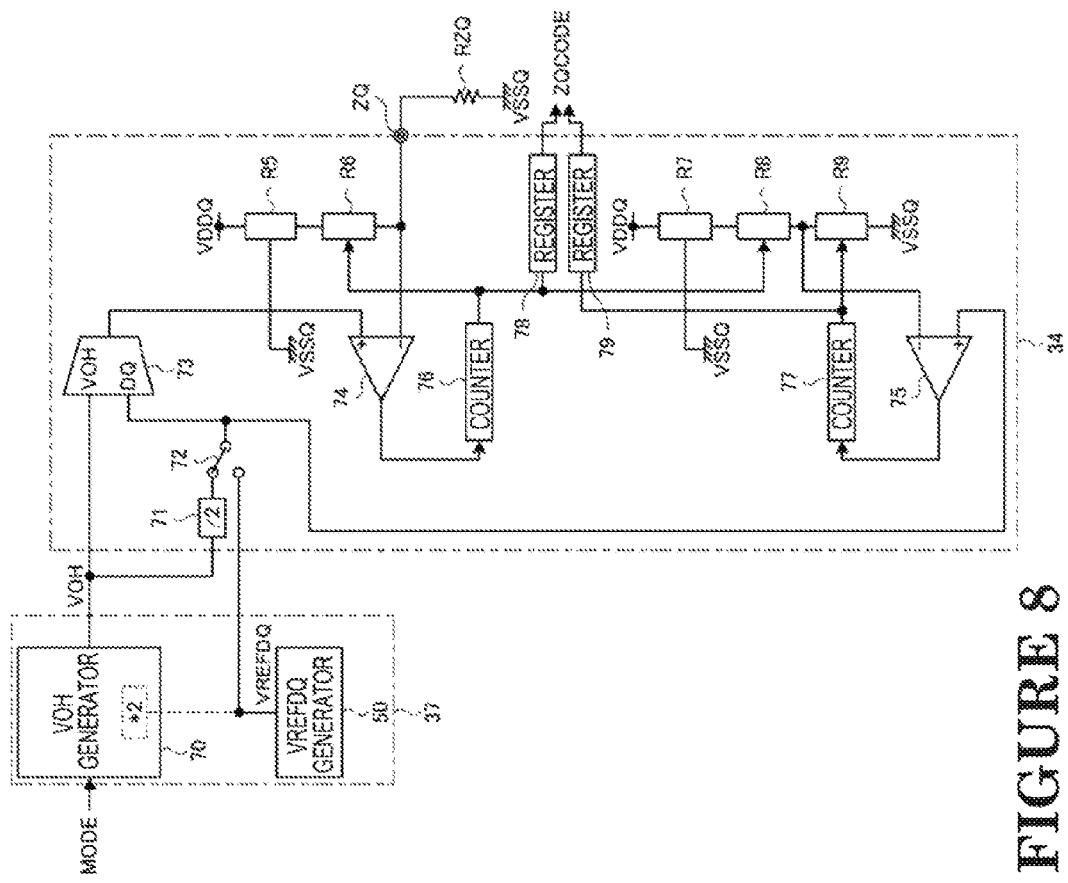
FIG. 8 is a block diagram showing a third example of the configuration of the calibration circuit and the internal supply voltage generating circuit of FIG. 2.

Referring to FIG. 8, the third example of the configuration of the calibration circuit 34 and internal supply voltage generating circuit 37 will then be described.

The internal supply voltage generating circuit 37 of this example has a VOH generator 70 provided in place of the VOH generator 51. The VOH generator 70 is supplied with the mode signal MODE from the register 14 of FIG. 2. When the mode signal MODE has a voltage at a first voltage level, the VOH generator 70 generates the reference voltage VOH through the same mechanism as that of the VOH generator 51 of FIG. 6. When the mode signal MODE has a voltage at a second voltage level, the VOH generator 70 generates the reference voltage VOH by amplifying the reference voltage VREFDQ generated by the VREFDQ generator 50 to two times the original.

As shown in FIG. 8, the calibration circuit 34 has the fifth to ninth single replica circuits R5 to R9, an amplifying circuit 71, a switch circuit 72, a multiplexer 73, comparators 74 and 75, counters 76 and 77, and registers 78 and 79. The fifth to ninth replica circuits R5 to R9 are the same as the replica circuits of FIG. 7. According to this example, the calibration terminal ZQ is connected to the power line supplied with the supply voltage VSSQ, via the reference resistance RZQ, as shown in FIG. 7.

The amplifying circuit 71 is a circuit that generates the reference voltage VREFDQ by reducing the reference voltage VOH generated by the VOH generator to ½ of the original. The switch circuit 72 selects either the reference voltage VREFDQ generated by the VREFDQ generator 50 or the reference voltage VREFDQ generated by the amplifying circuit 71 and supplies the selected reference voltage VREFDQ to the multiplexer 73 and to the comparator 75.

The multiplexer 73 has an input terminal supplied with the reference voltage VOH from the VOH generator 70 and another input terminal supplied with the reference voltage VREFDQ from the switch circuit 72. The multiplexer 73 has a function of selecting one of these input terminals and internally connecting the selected input terminal to the output terminal of the multiplexer 73.

The non-reverse input terminal of the comparator 74 is connected to the output terminal of the multiplexer 73, while the reverse input terminal of the comparator 74 is connected to the calibration terminal ZQ. The output terminal of the comparator 74 is connected to the counter 76, which generates part of the calibration code ZQCODE (partial codes PU1on to PU5on of FIG. 4) based on an output signal from the comparator 74. The generated partial codes PU1on to PU5on are supplied to the sixth replica circuit R6 and to the eighth replica circuit R8.

The non-reverse input terminal of the comparator 75 is supplied with the reference voltage VREFDQ from the switch circuit 72. The reverse input terminal of the comparator 75 is connected to the other end of the eighth replica circuit R8 (point of connection to the ninth replica circuit R9). The output terminal of the comparator 75 is connected to the counter 77, which generates the rest of the calibration code ZQCODE (partial codes PD1on to PD5on of FIG. 4) based on an output signal from the comparator 75. The generated partial codes PD1on to PD5on are supplied to the ninth replica circuit R9.

The register 78 is capable of storing the partial codes PU1on to PU5on output from the counter 76. Similarly, the register 79 is capable of storing the partial codes PD1on to PD5on output from the counter 77.

According to the calibration operation of this example, the multiplexer 73 is controlled first to cause it to output the reference voltage VREFDQ. In this state, the impedance of the sixth replica circuit R6 is adjusted through the comparator 74 and counter 76 so that a voltage at the calibration terminal ZQ becomes equal to the reference voltage VREFDQ. When the reference voltage VREFDQ is determined to be ⅙ of the supply voltage VDDQ, the joint impedance of the fifth and sixth replica circuits R5 and R6 resulting from the calibration operation becomes five times the resistance value of the reference resistance RZQ.

Subsequently, as output of the reference voltage VREFDQ from the multiplexer 73 is maintained, the impedance of the ninth replica circuit R9 is adjusted through the comparator 75 and counter 77 so that a voltage at the other end of the eighth replica circuit R8 (point of connection to the ninth replica circuit R9) becomes equal to the reference voltage VREFDQ. When the reference voltage VREFDQ is determined to be ⅙ of the supply voltage VDDQ, the impedance of the ninth replica circuit R9 resulting from the calibration operation becomes equal to the resistance value of the reference resistance RZQ.

At this point of time, the register 79 stores therein the partial codes PD1on to PD5on output from the counter 77. Hence the partial codes PD1on to PD5on corresponding to the impedance equal to the resistance value of the reference resistance RZQ is supplied to the output control circuit 17 of FIG. 3.

Subsequently, the multiplexer 73 is controlled to cause it to output the reference voltage VOH. In this state, the impedance of the sixth replica circuit R6 is adjusted through the comparator 74 and counter 76 so that a voltage at the calibration terminal ZQ becomes equal to the reference voltage VOH. When the reference voltage VOH is determined to be ⅓ of the supply voltage VDDQ, the joint impedance of the fifth and sixth replica circuits R5 and R6 resulting from the calibration operation becomes two times the resistance value of the reference resistance RZQ.

At this point of time, the register 78 stores therein the partial codes PU1on to PU5on output from the counter 76. Hence the partial codes PU1on to PU5on corresponding to the impedance equal to two times the resistance value of the reference resistance RZQ is supplied to the output control circuit 17 of FIG. 3.

In this manner, the calibration operation according to the third example produces the same result as produced by the calibration operation described above referring to FIG. 6.

Figure 9:
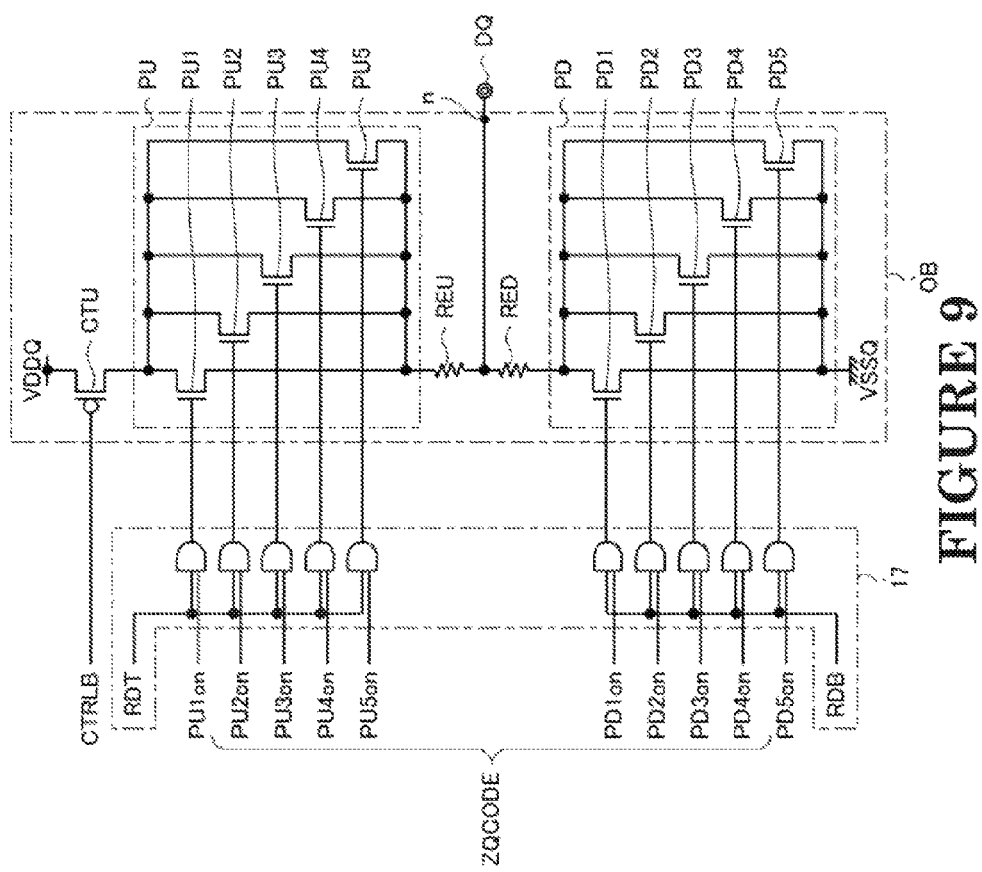
FIG. 9 is a circuit diagram showing a second example of the internal configuration of the output control circuit and the output buffer of FIG. 3.

Referring to FIG. 9, an example of the internal configuration of the output control circuit 17 and output buffer OB of FIG. 3 will then be described. According to this example, a resistance REU is interposed between the pull-up circuit PU and the output node n, while a resistance RED is interposed between the pull-up circuit PD and the output node n. It is preferable that the resistance value of each of the resistances REU and RED be about 60Ω. Using such resistances REU and RED protects the input/output circuit 16 from a high voltage that may be applied to the data input/output terminal DQ as a result of static spark.

Figure 10:
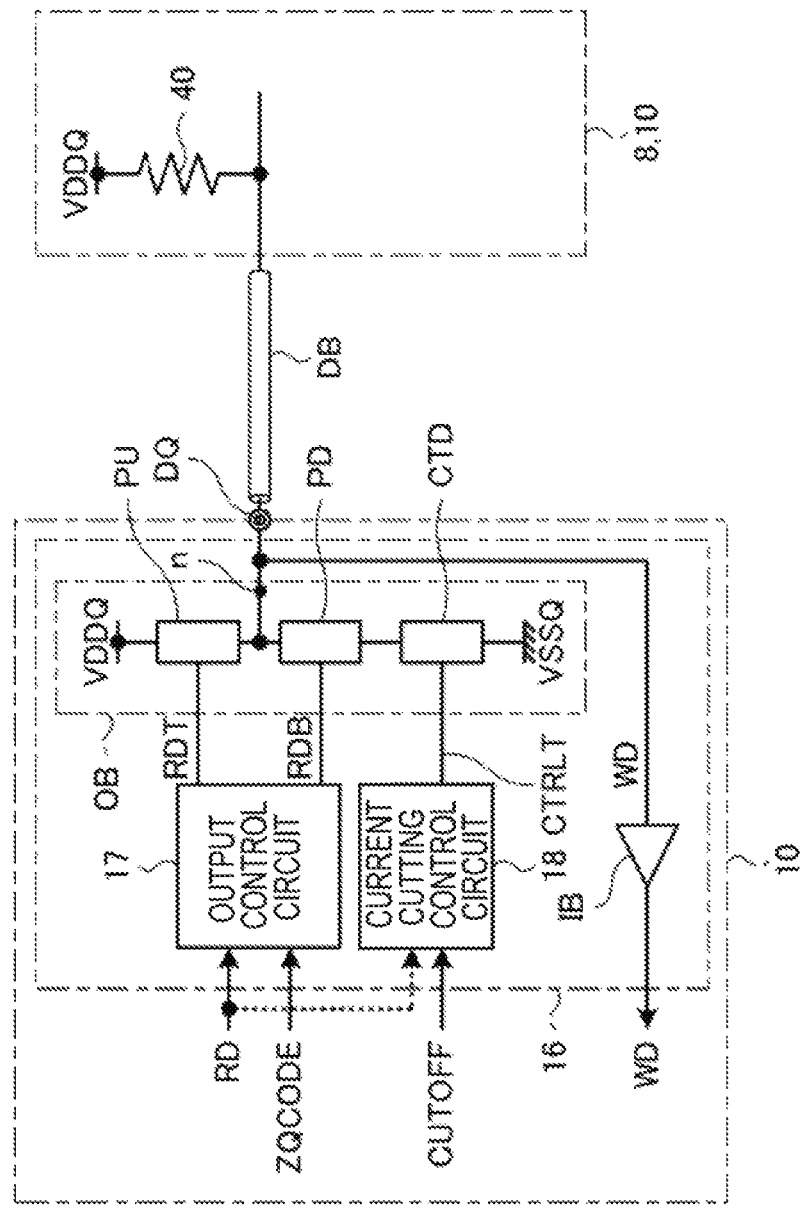
FIG. 10 is a block diagram of a second example of the internal configuration of the input/output circuit of FIG. 2.
Figure 11:
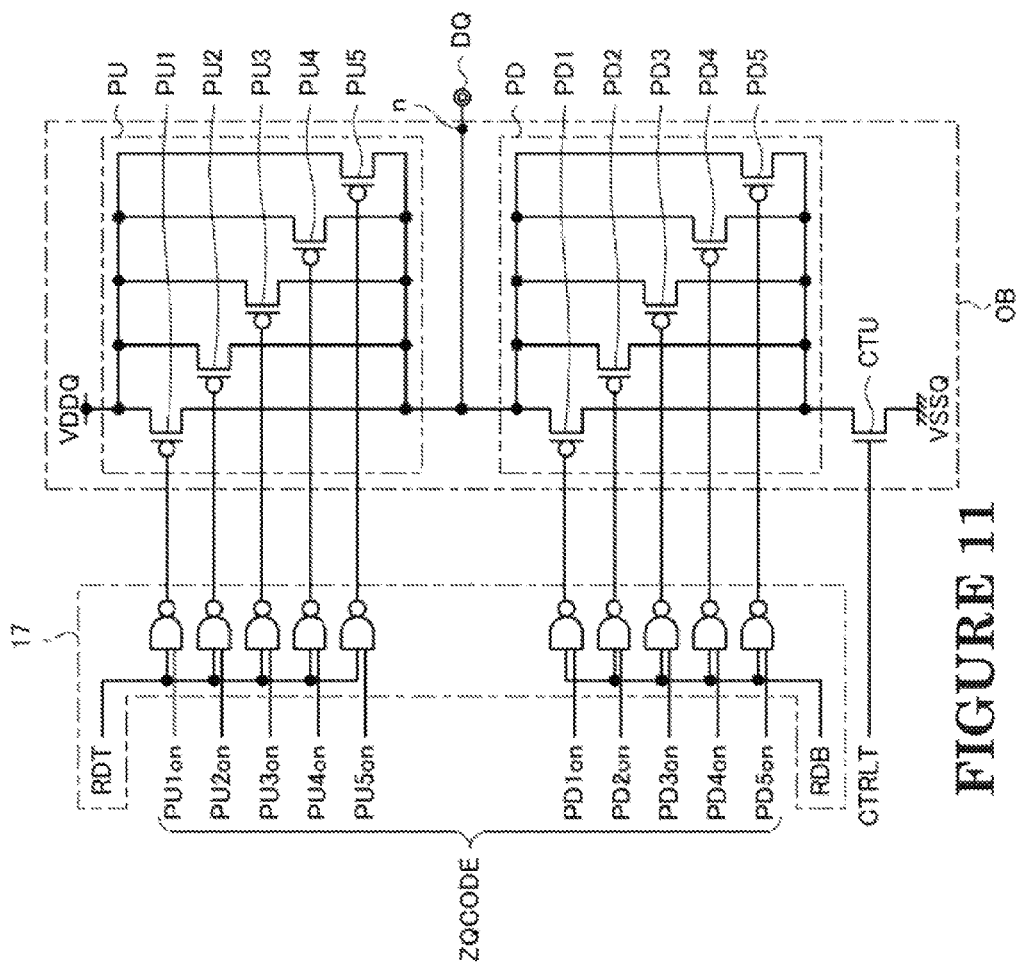
FIG. 11 is a circuit diagram showing an internal configuration of the output control circuit and the output buffer of FIG. 10.

Referring to FIGS. 10 and 11, a second example of the internal configuration of the input/output circuit 16 of FIG. 2 will then be described. According to this example, as shown in FIG. 10, the terminator 40 is disposed between the data bus DB and the power line supplied with the supply voltage VDDQ (second supply voltage). It is preferable in this case that the current cutting circuit CTD (first current cutting circuit) be interposed not between the pull-up circuit PU (second output circuit) and the power line supplied with the supply voltage VDDQ but between the pull-down circuit PD (first output circuit) and the power line supplied with the supply voltage VSSQ (first supply voltage), as shown in FIG. 10. It is also preferable that the pull-up circuit PU and the pull-down circuit PD be each composed of P-channel type MOS transistors, as shown in FIG. 11. However, the pull-up circuit PU may be composed of N-channel type MOS transistors as the pull-down circuit PD is composed of P-channel type MOS transistors, or the pull-up circuit PU and the pull-down circuit PD may be each composed of N-channel type MOS transistors.

It is preferable that the current cutting circuit CTD be composed of one N-channel type MOS transistor. A threshold voltage for this MOS transistor is determined to be higher than a threshold voltage for each of the MOS transistors of the pull-down circuit PD. When the pull-down circuit PD is made up of the MOS transistors with a low threshold voltage, therefore, a sub-threshold leakage current from the pull-down circuit PD that may flow through the terminator 40 and the output node n can be cut off by switching off the current cutting circuit CTD.

The current cutting circuit CTD is switched on and off under control by the current cut control circuit 18, as the current cutting circuit CTU does. In this case, the current cut control circuit 18 generates a control signal CTRLT for controlling the conduction state of the current cutting circuit CTD, in response to the cutoff control signal CUTOFF supplied from the command decoder 33. Specific control over the current cutting circuit CTD is the same as the control over the current cutting circuit CTU shown in FIG. 5, except that "ON" and "OFF" in the pattern [4] are switched for each other.

In this manner, according to the semiconductor device 10 of this example, when the terminator 40 is disposed between the data bus DB and the power line supplied with the supply voltage VDDQ, a reduction in a sub-threshold leakage current generated in the stand-by mode is achieved in a preferable manner. The current cutting circuit CTD must be located closer to the power line than the pull-down circuit PD in the same manner as in the case of the current cutting circuit CTU.

Figure 12:
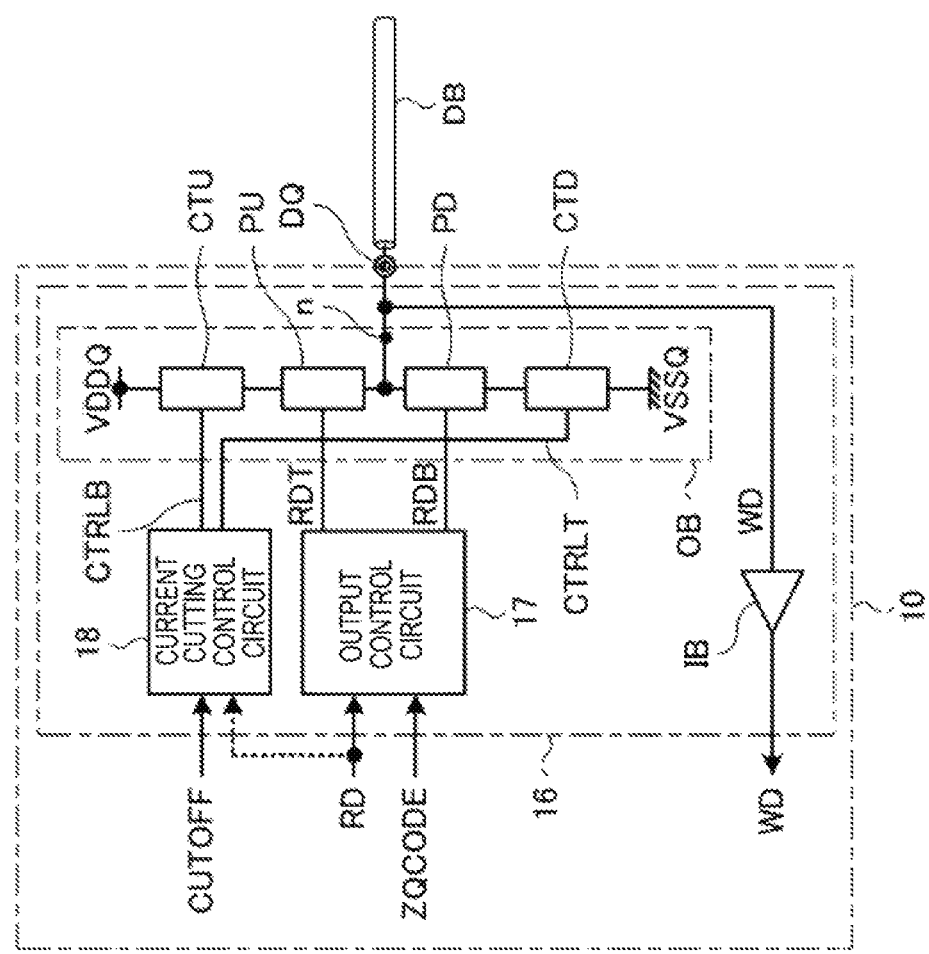
FIG. 12 is a block diagram of a third example of the internal configuration of the input/output circuit of FIG. 2.

Referring to FIG. 12, a third example of the internal configuration of the input/output circuit 16 of FIG. 2 will then be described. This example applies preferably to a case where whether the terminator 40 is disposed between the data bus DB and the power line supplied with the supply voltage VSSQ as in the example of FIG. 3 or disposed between the data bus DB and the power line supplied with the supply voltage VDDQ as in the example of FIG. 10 is not known.

Specifically, the input/output circuit 16 according to this example is provided with both current cutting circuit CTU (first current cutting circuit) of FIG. 3 and current cutting circuit CTD (second current cutting circuit) of FIG. 10. According to the semiconductor device 10 of this example, therefore, a reduction in a sub-threshold leakage current generated in the stand-by mode is achieved in a preferable manner in the case of disposing the terminator 40 between the data bus DB and the power line supplied with the supply voltage VSSQ (second supply voltage) as well as in the case of disposing the terminator 40 between the data bus DB and the power line supplied with the supply voltage VDDQ (first supply voltage).

Embodiments of the present invention have been described above. The present invention is not limited to the above embodiments and may be modified into various forms under the condition that the modified forms do not deviate from the substance of the invention. Obviously, the modified forms are included in the scope of the invention.

Figure 13:
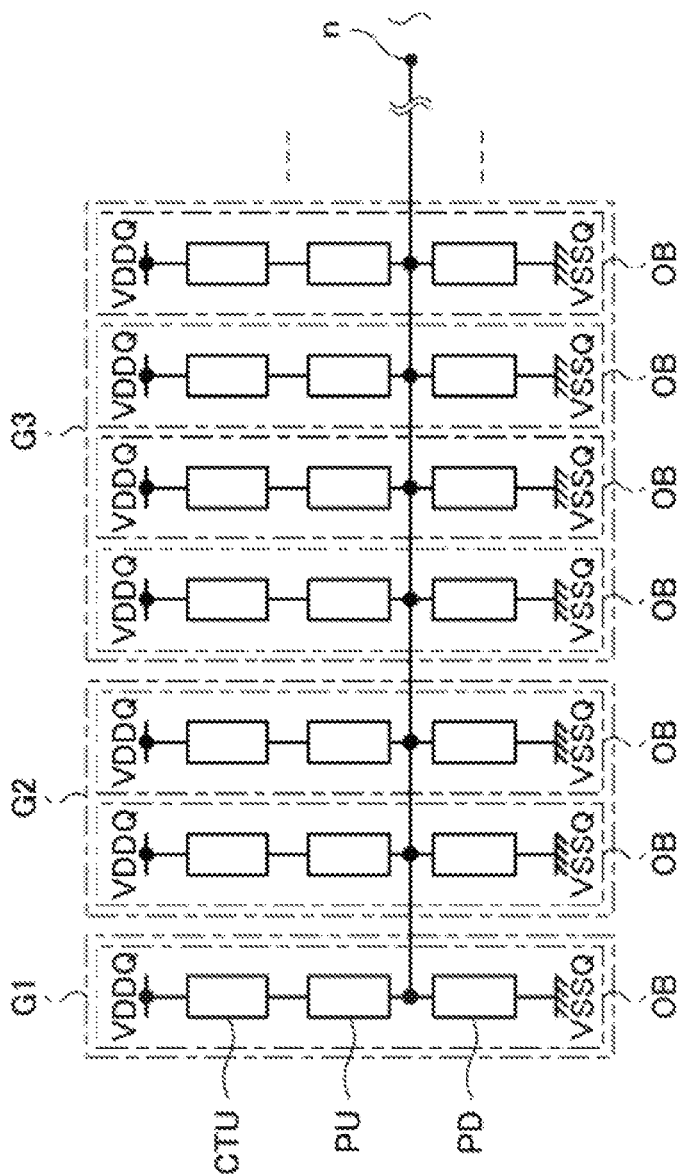
FIG. 13 is an example of a configuration of the current cut circuit and the pull-up circuit of FIG. 3.

For example, according to the above embodiments, only one output buffer OB is connected to the output node n, However, multiple output buffers OB may be connected in parallel with the output node n. It is preferable in this case that the output buffers OB be equal to each other in the transistor size of the current cutting circuit CTD, pull-up circuit PU, and pull-down circuit PD that make up each output buffer OB. This configuration allows adjusting the impedance of the output buffer OB in an adjustment range wider than an adjustment range achieved by the calibration operation. Specifically, for example, each buffer group Gn consisting of $2^n$ (n denotes an integer of 0 or larger one) output buffers OB is used for outputting the read data or is constantly switched off according to presetting, as shown in FIG. 13. Such buffer groups can produce impedance equivalent to $1/2^k$–1 denotes any one of integers ranging from 1 to n) of impedance produced by one output buffer OB (e.g., 240Ω).

According to the above embodiments, each of the current cutting circuits CTU and CTD is composed of one MOS transistor. Each of these circuits, however, may be composed of multiple MOS transistors connected in parallel. The current cutting circuits CTU and CTD having such a configuration can be adjusted in impedance in the same manner as the pull-up circuit PU and the pull-down circuit PD.

What is claimed is:

1. A device comprising:
   first and second power terminals;
   an output terminal;
   a plurality of first output transistors each including a first gate and first and second nodes, the first node of each of the first output transistors being coupled to the first power terminal and the second node of each of the first output transistors being coupled to the output terminal;
   a plurality of second output transistors each including a second gate and third and fourth nodes, the third node of each of the second output transistors being coupled to the output terminal and the fourth node of each of the second output transistors being coupled to the second power terminal;
   a control circuit producing a set of first control signals and a set of second control signals, the first control signals being supplied respectively to the first gates of the first output transistors to render selected one or ones of the first output transistors conductive or to render each of the first output transistors non-conductive, and the second control signals being supplied respectively to the second gates of the second output transistors to render selected one or ones of the second output transistors conductive or to render each of the second output transistors non-conductive; and
   a cutting circuit inserted between at least one of the first and second power terminals and the output terminal and being rendered non-conductive when all of the first and second output transistors are rendered non-conductive by the control circuit.

2. The device according to claim 1, wherein each of the first and second output transistor is of a first conductivity type.

3. The device according to claim 1, wherein the cutting transistor has a higher threshold voltage than each of the first and second output transistors.

4. The device according to claim 1, comprising:
   a first resistor inserted between the first node of each of the first power terminal and the output terminal; and
   a second resistor inserted between third node of each of the output terminal and the second power terminal.

5. The device according to claim 1, comprising:
   a calibration circuit coupled to the control circuit and comprising:
   a replica cutting circuit replicating the cutting circuit; and
   a plurality of replica output transistors each replicating a corresponding one of the first and second output transistors.

6. The device according to claim 5, wherein the calibration circuit is configured to produce a plurality of first calibration signals and second calibration signals; and wherein the control circuit is configured to produce the first and second control signals according to the first and second calibration singles and a read data signal.

7. The device according to claim 1, wherein the cutting circuit is inserted between the first and second power terminals in series with the plurality of first output transistors and the plurality of second output transistors.

8. A device comprising:
   first and second power supply lines;
   a data terminal;
   a first output circuit coupled between the first power supply line and the data terminal, and the first output circuit comprising a plurality of first output transistors coupled in parallel to each other, each of the first output transistors being of a first conductivity type;
   a second output circuit coupled between the data terminal and the second power supply line, the second output circuit comprising a plurality of second output transistors coupled in parallel to each other, each of the second output transistors being of the first conductivity type;
   a plurality of first logic circuits each associated with a corresponding one of the first output transistors;
   a plurality of second logic circuits each associated with a corresponding one of the second output transistors; and
   a first cutting transistor inserted between the first and second power supply lines in series with the first and second output circuits.

9. The device according to claim 8, comprising:
   a memory cell array; and
   a read circuit configured to read data from the memory cell array to produce the read data signal.

10. The device according to claim 8, wherein the first conductivity type is an n-channel type.

11. The device according to claim 8, wherein each of the first logic circuits is configured to receive a read data signal, and each of the second logic circuits is configured to receive an inverted one of the read data signal.

12. The device according to claim 11, wherein each of the first logic circuits is configured to receive an associated one of a plurality of first calibration codes, and each of the second circuit is configured to receive an associated one of a plurality of second calibration codes.

13. The device according to claim 8, comprising:
   a first resistor inserted between the data terminal and the first output circuit; and a second resistor inserted between the data terminal and the second output circuit.

14. A device comprising:
   a data node supplied with a data signal;
   a plurality of first control nodes supplied with a plurality of first control signals, respectively;
   a plurality of second control nodes supplied with a plurality of second control signals, respectively;
   an output terminal;
   first and second intermediate nodes;

a plurality of first transistors each coupled between the output terminal and the first intermediate node and configured to drive the output terminal when rendered conductive in response to the data signal and an associated one of the first control signals;
a plurality of second transistors each coupled between the output terminal and the second intermediate node and configured to drive the output terminal when rendered conductive in response to the data signal and an associated one of the second control signals;
a power supply line;
a third control node supplied with a third control signal, the third control signal being independent of each of the first and second control signals; and
a cutting circuit coupled between the power supply line and one of the first and second intermediate nodes and configured to form an electrical path therebetween when rendered conductive in response to the third control signal and each of the plurality of first transistors and each of the plurality of second transistors is of a first conductivity type.

15. The device according to claim 14, further comprising:
a command decoder circuit producing a cutoff signal according to a command signal;
a cutting control circuit producing the second control signal in response to at least the cutoff signal.

16. The device according to claim 14, further comprising:
a memory array; and
a read circuit producing the read data signal in response to reading data from the memory array.

17. The device according to claim 14, further comprising:
a replica cutting circuit replicating the cutting circuit; and
a plurality of replica output transistor each replicating a corresponding one of the first and second transistors.

18. The device according to claim 14, wherein the cutting transistor is configured to be rendered nonconductive when all of the first and second output transistors are rendered non-conductive.

* * * * *